US011991861B2

(12) United States Patent
Gurlt et al.

(10) Patent No.: US 11,991,861 B2
(45) Date of Patent: May 21, 2024

(54) CONTROLLER AND MODULAR CONTROL SYSTEM OF AN INDUSTRIAL AUTOMATION SYSTEM

(71) Applicant: Weidmüller Interface GmbH & Co. KG, Detmold (DE)

(72) Inventors: Ingo Gurlt, Bielefeld (DE); Tobias Klug, Bad Salzuflen (DE); Michael Schnatwinkel, Herford (DE); Ralf Schumacher, Lemgo (DE); Michael Kroner, Oerlinghausen (DE); Klaus Püschner, Detmold (DE); Marc Strünkmann, Paderborn (DE)

(73) Assignee: WEIDMÜLLER INTERFACE GMBH & CO. KG (DE)

( * ) Notice: Subject to any disclaimer, the term of this patent is extended or adjusted under 35 U.S.C. 154(b) by 466 days.

(21) Appl. No.: 17/421,423

(22) PCT Filed: Jan. 8, 2020

(86) PCT No.: PCT/EP2020/050272
§ 371 (c)(1),
(2) Date: Apr. 15, 2022

(87) PCT Pub. No.: WO2020/144209
PCT Pub. Date: Jul. 16, 2020

(65) Prior Publication Data
US 2022/0256731 A1    Aug. 11, 2022

(30) Foreign Application Priority Data
Jan. 9, 2019 (DE) .......................... 202019100078.3

(51) Int. Cl.
*H05K 7/20* (2006.01)
*H02B 1/04* (2006.01)
(Continued)

(52) U.S. Cl.
CPC ........... *H05K 7/2039* (2013.01); *H02B 1/041* (2013.01); *H02B 1/052* (2013.01); *H05K 7/1475* (2013.01)

(58) Field of Classification Search
CPC .......... H02B 1/041; H02B 1/052; H02B 1/56; H05K 7/1462–1484
See application file for complete search history.

(56) References Cited

U.S. PATENT DOCUMENTS

| 5,775,955 A * | 7/1998 | Graube | ................ H01R 9/2658 439/716 |
| 6,802,737 B2 * | 10/2004 | Bergner | ............... H05K 7/1465 439/716 |

(Continued)

FOREIGN PATENT DOCUMENTS

| DE | 102006046194 A1 | 4/2008 | |
| DE | 202010004061 U1 * | 7/2010 | ........... H05K 7/1468 |

(Continued)

Primary Examiner — Robert J Hoffberg
(74) Attorney, Agent, or Firm — Laubscher & Fretwell, P.C.

(57) ABSTRACT

A controller for an industrial automation system includes a main module having a housing, which can be fitted onto a DIN rail via a base, at least two printed circuit boards arranged in the housing, and a heat sink also arranged in the housing and connected with the base. One of the circuit boards is a backplane bus printed circuit board, which provides a backplane bus, and the other is a main printed circuit board. The heat sink is attached to at least one of the printed circuit board to cool its components.

17 Claims, 35 Drawing Sheets

(51) Int. Cl.
*H02B 1/052* (2006.01)
*H05K 7/14* (2006.01)

(56) References Cited

U.S. PATENT DOCUMENTS

| | | | | |
|---|---|---|---|---|
| 8,379,398 | B2 * | 2/2013 | Correll | H05K 7/14 |
| | | | | 361/741 |
| 8,749,981 | B2 * | 6/2014 | Moore | H05K 7/20509 |
| | | | | 165/185 |
| 9,436,233 | B2 * | 9/2016 | Correll | G06F 1/184 |
| 9,521,773 | B2 * | 12/2016 | Izumi | H05K 7/1462 |
| 10,186,821 | B2 | 1/2019 | Muller | |
| 10,249,987 | B2 * | 4/2019 | Pathmanathan | H01R 13/6295 |
| 10,430,368 | B2 | 10/2019 | Rose et al. | |
| 10,503,680 | B2 * | 12/2019 | Rose | G06F 13/4068 |
| 10,827,634 | B2 * | 11/2020 | Schumacher | H05K 7/1474 |
| 11,178,791 | B2 * | 11/2021 | Williams | H05K 7/1474 |
| 2021/0068301 | A1 * | 3/2021 | Engel | H05K 7/20172 |
| 2021/0410323 | A1 * | 12/2021 | Best | H05K 7/20136 |
| 2022/0247159 | A1 * | 8/2022 | Fischer | H01H 71/082 |

FOREIGN PATENT DOCUMENTS

| | | | | |
|---|---|---|---|---|
| DE | 202010017443 | U1 | 4/2012 | |
| DE | 102015200336 | A1 * | 9/2015 | H01G 2/08 |
| DE | 102015201370 | A1 * | 9/2015 | H01G 2/08 |
| DE | 102014118389 | A1 | 6/2016 | |
| DE | 102015104290 | A1 | 9/2016 | |
| EP | 1258957 | A1 * | 11/2002 | H01R 9/2658 |
| EP | 1552983 | A1 | 7/2005 | |
| JP | 2002076661 | A * | 3/2002 | |
| WO | 2009120942 | A2 | 10/2009 | |
| WO | 2019008032 | A1 | 1/2019 | |
| WO | WO-2022201715 | A1 * | 9/2022 | |
| WO | WO-2023057628 | A1 * | 4/2023 | H05K 7/1462 |

\* cited by examiner

CONTROLLER AND MODULAR CONTROL SYSTEM OF AN INDUSTRIAL AUTOMATION SYSTEM

This application is a § 371 National Stage Entry of International Patent Application No. PCT/EP2020/050272 filed Jan. 8, 2020, which claims priority of DE 20 2019 100 078.3 filed Jan. 9, 2019. The entire content of these applications is incorporated herein by reference.

BACKGROUND

The present disclosure relates to a controller for an industrial automation system having a main module including a housing which can be fitted on a DIN rail by a base, and with at least two printed circuit boards which are arranged in the housing, one of these printed circuit boards being a backplane bus printed circuit board and the other being a main printed circuit board, wherein the main printed circuit board is assigned a heat sink for cooling of components and wherein the backplane bus printed circuit board provides a backplane bus. The invention furthermore relates to a modular control system with such a main module.

In industrial automation systems, controllers such as programmable memory controllers, programmable logic controllers ("PLC"), and programmable automation controllers ("PAC"), are used to activate actuators and to input/output data measured by sensors. In general, the actuators are activated or the sensors engaged via field appliances, which are connected to the controller by one or more field bus. Among other things, input and output modules ("I/O modules"), which provide analog and/or digital input or output channels, are included in the field appliances. Frequently, not every individual field appliance is attached directly to the field bus, but rather they are connected via a "field bus coupler" (also referred to as a "Remote I/O"), which includes an interface between the field bus and a sub-bus, by which a plurality of field appliances can be attached. Sensors and actuators can also be provided with a dedicated field bus terminal for connection to the field bus.

Alternatively, or additionally to the transfer via the field bus, field appliances can be attached directly to the controller to provide a sub-bus, which is comparable to a field bus coupler.

In general, installation of industrial automation systems involves arranging controllers in a switchgear cabinet, which includes mounting elements such as a DIN rail receptacle. A switchgear cabinet puts constraints on the geometric, mechanical, thermal and electrical layout of the controller. The space available for components of the controller, and in particular for terminals of the controller, is severely restricted. In addition, the thermal load can be high, such that, in the case of a compact construction, sufficient cooling of the components is necessary. In addition, requirements for performance and/or the available interfaces of the controller frequently change over time, and so it is desirable for the controller to be expandable.

BRIEF DESCRIPTION OF THE PRIOR ART

DE 10 2014 118 389 A1 discloses a controller with a main module, which provides the main functionality of the controller, that is expandable by one or more connection modules in order to operate the main module with various field bus systems. This can be costly, and thus not advantageous, because a main module must be combined with connection modules to produce a functional controller.

There is thus a need for a controller and a modular control system which enable cooling of electronic components while having a compact construction, and which are flexible with regard to printed circuit board surface area and connections.

SUMMARY OF THE DISCLOSURE

Accordingly, it's a primary object of the present disclosure to provide a controller for an industrial automation system having a main module that includes a heat sink arranged in a housing and attached to the housing base to support at least one printed circuit board arranged within the housing. Preferably, the heat sink is attached to one of the circuit boards. The support provided by the heat sink is a central element of the controller. This provides optimal use of the space available in the housing so that a compact main module with a high component density can be produced. In addition, assembly of the main module is simplified because the printed circuit boards and heat sink can be preassembled and then inserted and connected as a whole into the base.

In an advantageous configuration of the controller, the heat sink has a substantially parallelepipedal configuration with two mutually perpendicular outer surfaces. Thus, the heat sink can be arranged such that one wall lies parallel to the main printed circuit board and one lies parallel to the backplane bus printed circuit board. The backplane bus printed circuit board is then arranged in the base and a main printed circuit board is arranged perpendicular thereto. The circuit boards can be connected to one another in a compact manner via the heat sink. In a preferred embodiment, the main printed circuit board and the backplane bus printed circuit board are attached to the heat sink.

Further, at least one outer surface of the heat sink preferably includes a cooling surface, with which the components of the main printed circuit board are in thermal contact. The cooling surface can be formed in a stepped manner and can have plateaus at different heights to equally and efficiently contact structural elements of the main printed circuit board at different heights.

In a further advantageous configuration of the controller, the heat sink has at least one mounting foot which protrudes into the base and is attached therewith. Attaching the heat sink to the base uses space that is available in the base allowing for more space in the region situated above the base to be available for printed circuit boards. In addition, by extending the heat sink into the base, there is a greater cooling surface for the main printed circuit board, which is parallel to the cooling surface of the heat sink. Thus, additional equipment space is available on the main printed circuit board without further enlarging the installation height of the main module above the DIN rail. A section of the main printed circuit board can, therefore, protrude into the base. This can also be used for ground contacting to the DIN rail via a contact spring arranged in the base.

To rapidly and easily mount the main module, the heat sink and printed circuit boards are configured to form an assembly which is arranged within the housing and attached to the base via at least one mounting foot.

In a further configuration of the controller, the heat sink has inner cooling fins which form cooling channels within the heat sink. Preferably, the inner cooling fins are arranged perpendicular to the main printed circuit board to optimally dissipate heat. Therefore, the heat sink has large outer cooling surfaces that are in thermal contact with components of the main module, as well as cooling channels, thus achieving a high level of cooling performance.

In yet another configuration of the controller, the heat sink has outer cooling fins and the main module includes at least one additional printed circuit board that is arranged adjacent to these fins. The space between the outer cooling fins can, therefore, be used optimally by arranging additional printed circuit boards therebetween, which creates further installation space in the housing for components. The outer cooling fins preferably run parallel to the main printed circuit board. Preferably at least one of the outer cooling fins, in a longitudinal direction, is shorter than other sections of the heat sink, which creates space for electrical connections between the main printed circuit board and the additional printed circuit board(s).

According to the embodiments of the present disclosure, the main module is formed such that it can be operated autonomously as a monolithic controller. It can also be connected via a field bus to field appliances, to an output station (Remote I/O), which has a field bus coupler and/or to input and/or output modules (I/O modules). In addition to control functions, the main module itself can also act as a field bus coupler and has direct connections for I/O modules. Finally, I/O modules can be contained directly in the main module or plug-in locations for I/O modules can be provided with the main module.

Moreover, the main module can also provide connections for expansion modules such that the controller can be operated as a modular control system. The functional scope of the control system can be supplemented, for example, with a safety control module, servo drive modules, rapid and highly accurate I/O and camera modules for manufacturing-measurement and test technology, memory modules/data loggers, multipliers/switches, media converters, repeaters, gateways and routers with a sniffer and analysis function (e.g. with predictive analytics).

In another embodiment, the main module is connected with a laterally stacked expansion module, wherein the main module has a plug connector which is coupled to the backplane bus printed circuit board.

It is also an object of the present disclosure to provide a control system that includes a controller as described above with a main module that is expanded by at least one stacked expansion module, wherein the main module is connected to the expansion module via a backplane bus printed circuit board. This controller provides an additionally flexible and expandable system.

BRIEF DESCRIPTION OF THE FIGURES

The controller and the control system according to the invention are described in more detail below with reference to the figures in which.

DETAILED DESCRIPTION

Figure 1:
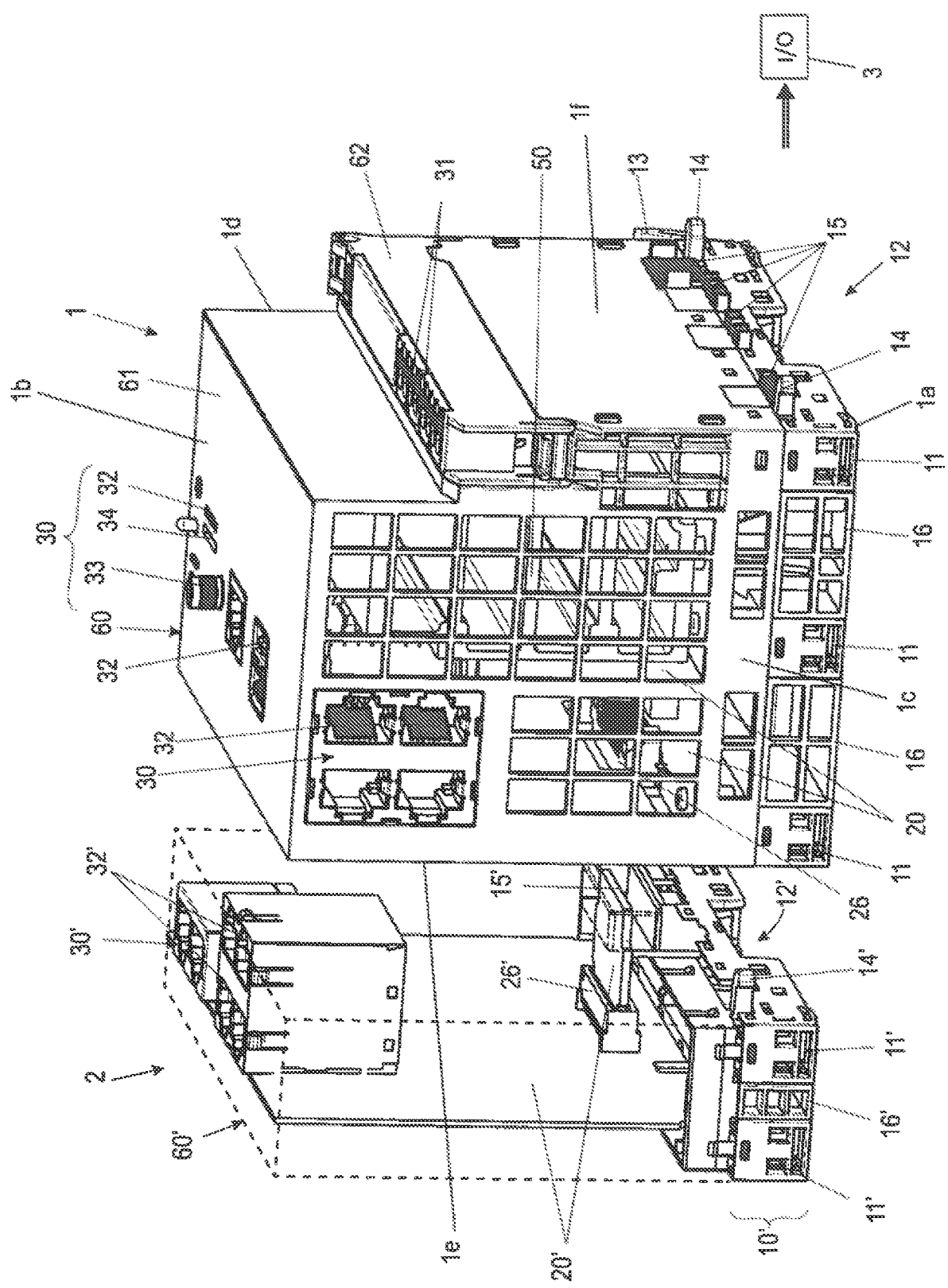
FIG. 1 is an exploded perspective view of a control system.

FIG. 1 shows, in a perspective view, a first exemplary embodiment of a control system. The control system includes a main module 1 and an expansion module 2.

Within the framework of this application, identical reference numbers in all figures denote identical or identically acting elements. In the case of the expansion module 2, reference numbers of the components are provided with an apostrophe.

The control system from FIG. 1 is configured for mounting in a switchgear cabinet. The usual mounting orientation is such that the control system is rotated so that the lower, non-visible side in FIG. 1 is set vertically in the switchgear cabinet. This side will also be referred to hereinafter as the "mounting side" 1a. The side situated at the top in FIG. 1 is thus oriented parallel to the mounting side when mounted in a switchgear cabinet. It faces the operator or user and will be referred to hereinafter as the "front side" 1b. The side facing the viewer in FIG. 1, is horizontal when mounted in a typical switchgear cabinet and will be referred to hereinafter as the "lower side" 1c. The side facing away from the viewer, not visible in FIG. 1, which is likewise horizontal when mounted in the switchgear cabinet, will be referred to as the "upper side" 1d.

Connected to the left side of the main module 1 in FIG. 1 is the expansion module 2, which is shown separated from the main module 1. This left side 1e of the main module 1 or 2e of the expansion module 2 is also the left side when mounted in the switchgear cabinet and will be referred to as such hereinafter. Input/output modules 3 can also be connected to the right side 1f of the main module 1, which is also the right side of the main module 1 when mounted in the switchgear cabinet and will be referred to as such hereinafter.

The main module 1 has a base 10, onto which a housing cover 60 is fitted. The base 10, as depicted in this embodiment, is preferably made up of several components, including three latching supports 11, oriented parallel to one another, which are spaced apart from one another by spacing elements 16. The latching supports 11 serve to attach the main module 1 to a DIN rail of a switchgear cabinet (not shown), onto which they can be latched.

On the upper side 1d of the main module 1, at each latching support 11, release levers 13 are arranged which release the latching supports 11 upon actuation so that the main module 1 can be removed from the DIN rail. The latching support 11 arranged on the right side 1f of the main module 1 has projecting latching hooks 14, with which the input/output modules 3 can be latched onto to connect with the main module 1. The input/output modules 3 are equipped with comparable latching supports so that they can be fitted onto the DIN rail and latched onto the main module 1.

The right latching support 11 of the main module 1 additionally supports various bus contacts 15 by which a power supply and data can be transferred to input/output modules 3. The mechanical configuration of the right side 1f of the main module 1 and the electrical and mechanical configuration of the bus contacts 15 correspond to that of a system-identical field bus coupler, such that input/output modules 3 constructed for the system-identical field bus coupler can be attached directly to the main module 1 of the control system. This enables direct use of input/output modules 3 without an interposed field bus and field bus coupler.

The right side 1f of the main module 1 is configured with the same form factor as connectable input/output modules 3, including a section with power supply terminals 31. The power supply terminals 31 are plug-in elements with a printed circuit board edge connector. The plug-in elements can be plugged onto a printed circuit board that is arranged underneath (shown in FIG. 2a or 3a). The plug-in elements provide various desired contact types as power supply terminals 31, such as push-in contacts, screw contacts or plug connectors. In order to exchange the plug-in elements of the power supply terminals 31, the housing cover 60 includes a hinged strip 62 that can be folded up. This system and this form factor are preferably implemented in a comparable manner in input/output modules 3.

Adjacent to the section with power supply terminals 31, the installation space of the main module 1 is larger and accordingly the housing cover 60 includes a larger main cover 61 that projects upwards beyond the hinged strip 62. On the lower 1c and upper 1d sides, there are ventilation breakouts 63 providing a convection airstream that passes through the main module 1 from the bottom up when connected with a DIN rail. In the case of extreme thermal ambient conditions, a fan can be fitted on the lower side 1c or the upper side 1d of the main cover 61 to draw a forced airstream through the main module 1 for better cooling. In harsher ambient conditions, filter elements can be included to minimize the ingress of dirt through the ventilation breakouts 63.

In the embodiment of the main module 1 shown in FIG. 1, terminals 30 are provided on the lower side 1c, whereas the front side 1b of the main module 1 has switching and signal elements 40, for example status indicators, switches or pushbuttons. An antenna terminal 33 and a memory card terminal 34 with an insertion slot for a micro SD memory card are arranged on the front side. Details on the inner structure of the main module 1 are explained below.

The expansion module 2, which can be plugged onto the left side 1e of the main module 1, has a comparable structure to that of the main module. The expansion module 2 also includes a base 10', which has latching supports 11' spaced apart from one another by spacing elements 16', and latching hooks 14' for latching to the main module 1.

Figure 2A:
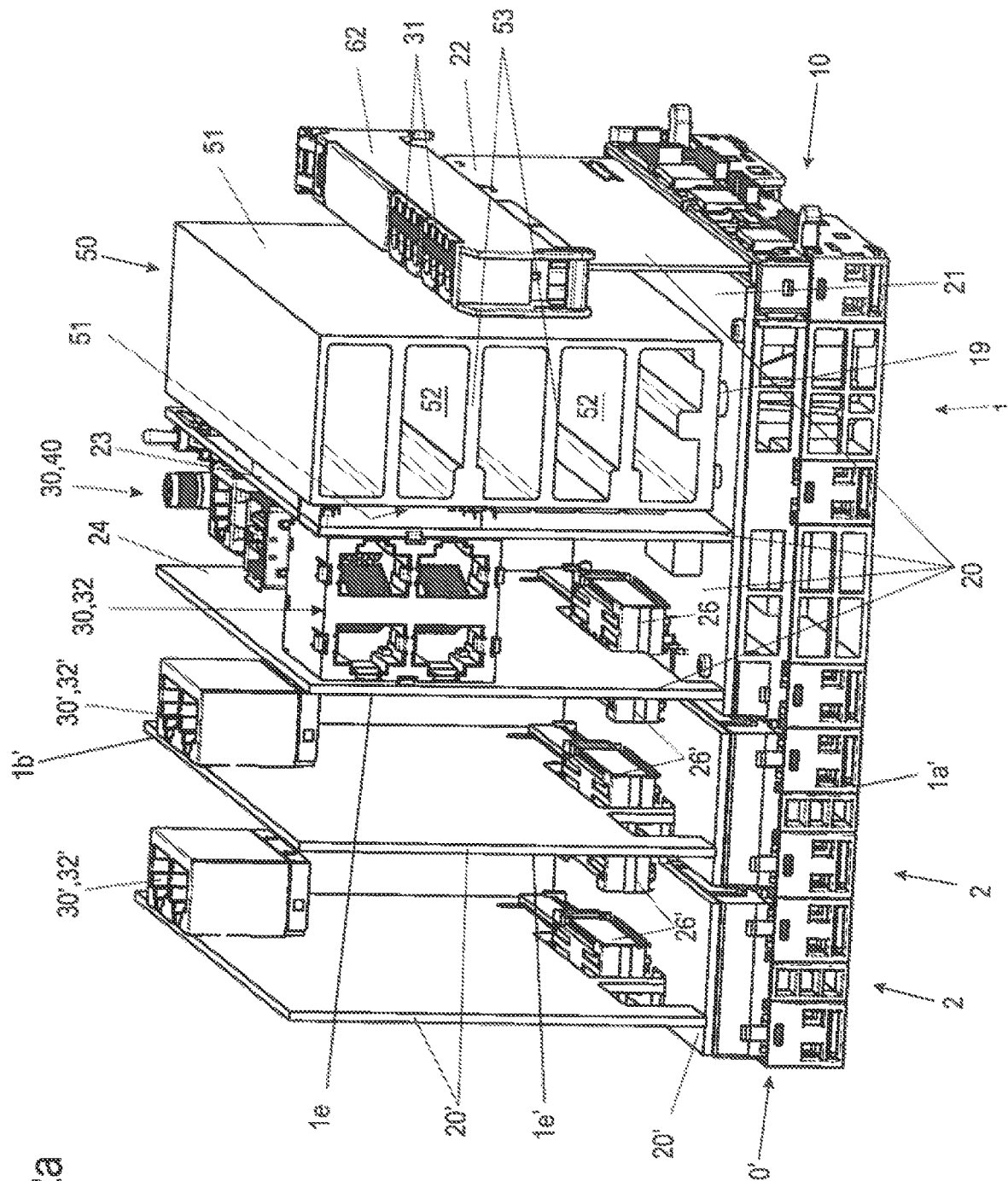
FIGS. 2a and 2b are perspective views, respectively, of a further exemplary embodiment of a control system.

In FIG. 1, a housing cover 60' of the expansion module 2 is indicated by dashed lines and otherwise depicted transparently so that the inner structure of the module is visible. In the expansion module 2, a printed circuit board 20' is arrange perpendicular to the top of the base 10' and supports terminals 30' at its upper end, which are accessible from the front side 1b' of the expansion module 2. On the right side 1f' of the expansion module 2, there are bus contacts 15', which in this case are printed circuit board edge connectors that couple the main module 1 with the expansion module 2. Two printed circuit boards 20' can be arranged parallel to one another in a supplementary module 2 (as shown in FIG. 2a) to enlarge the equipment space and/or to enlarge the article variance of the expansion modules 2. This can be done inexpensively via equipment variants of the terminals on the two printed circuit boards 20. The structure of the expansion module 2 will be explained in more detail below.

Figure 2B:
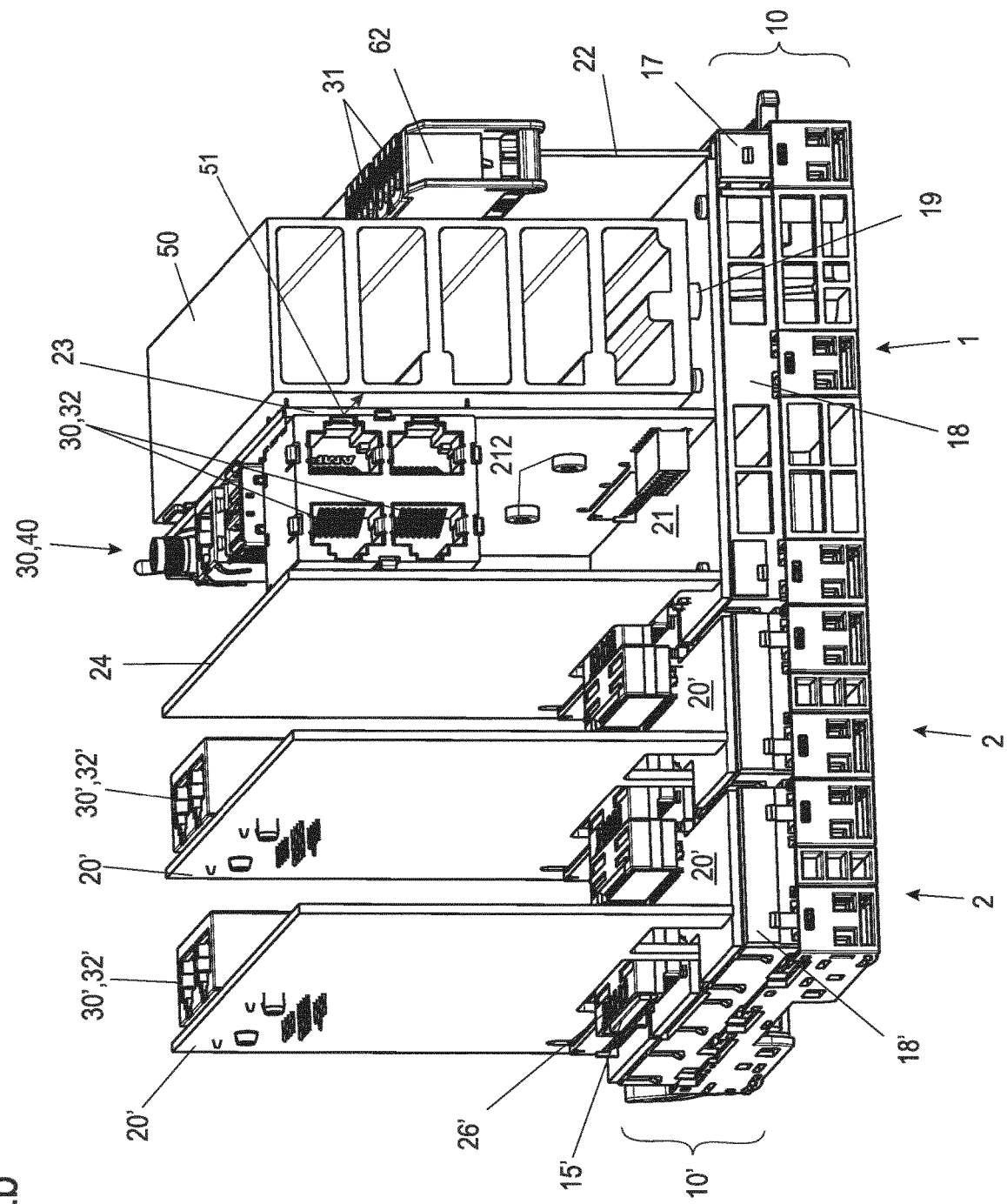
Figure 2C:
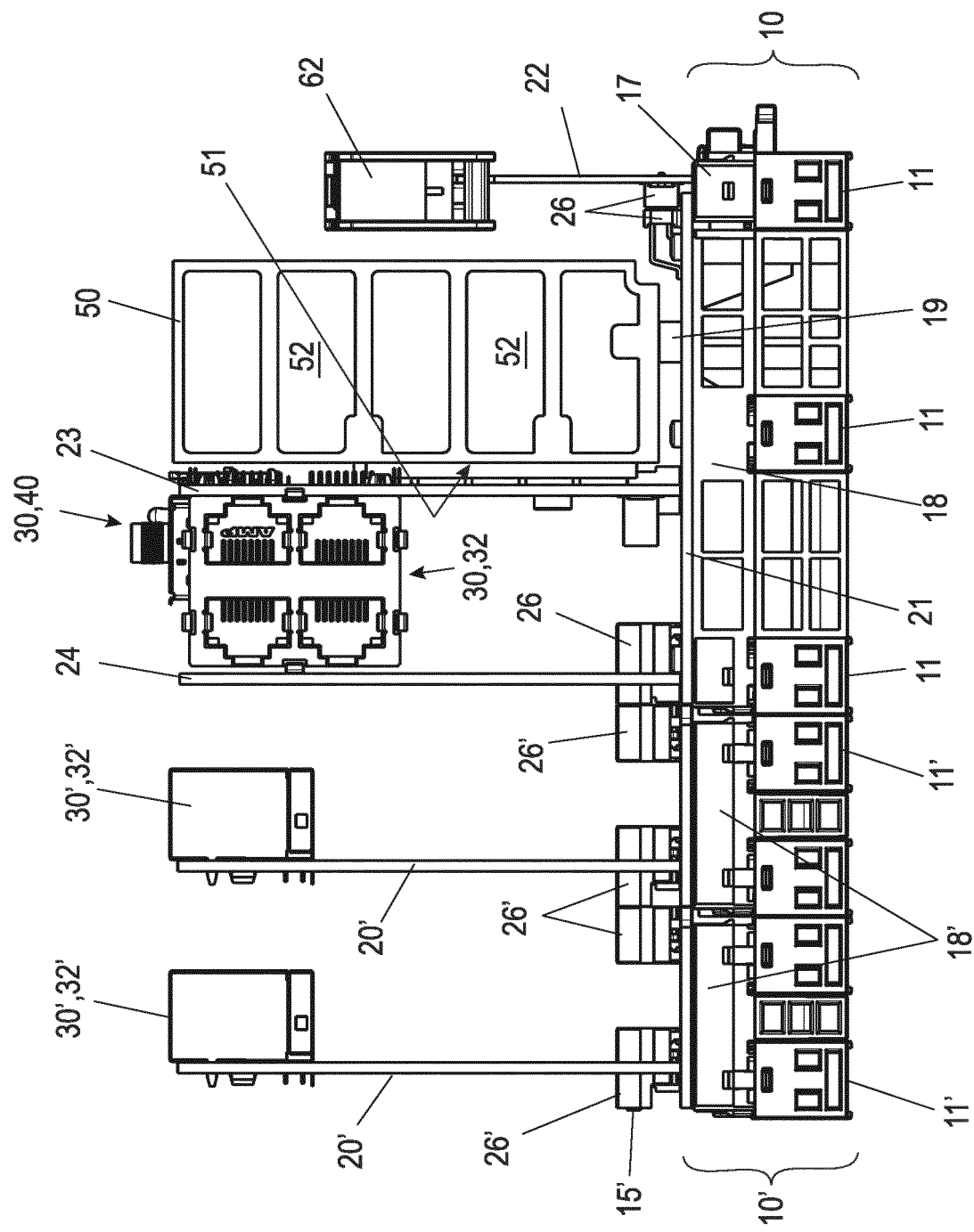
FIG. 2c is a front plan view of the embodiment of FIGS. 2a and 2b.

A further exemplary embodiment of a control system is depicted in various views in FIGS. 2a to 2c. FIGS. 2a and 2b each show a perspective view from two different perspectives and FIG. 2c shows a plan view of one side of the control system. In FIGS. 2a to 2c the housing covers 60, 60' are removed to provide a view into the inner structure of the control system.

In the case of the control system depicted in FIGS. 2a to 2c, a main module 1 is connected to two expansion modules 2. Both expansion modules 2 are plugged in one behind the other on the left side 1e of the main module 1. Therefore, a first expansion module 2 is connected directly to the main module 1 and a second expansion module 2 is plugged into the first expansion module 2. This is possible because the bus contacts 15' of the expansion module 2 are passed through the printed circuit boards 20', such that several expansion modules 2 can be stacked one after the other. To achieve this purpose, the left side 1e' of each expansion module 2 is configured similarly to the left side 1e of the main module 1.

In terms of the basic structure, the main module 1 and the depicted expansion modules 2 are constructed in a comparable way to the first embodiment shown in FIG. 1. There are small differences relating to the configuration of the heat sink 50, which takes up the entire installation height of the main module 1 embodiment shown in FIGS. 2a to 2c, whereas in the embodiment in FIG. 1 there remains a free space above the heat sink 50, which can be used for another purpose.

Referring again to FIGS. 2a to 2c, the bus contacts are not printed circuit board edge connectors as with FIG. 1, but rather are plug connectors 26 and 26', respectively, that have bus contacts 15' and are plugged into one another. To stack several expansion modules 2, the expansion modules in FIGS. 2a to 2c have a printed circuit board 20' that is oriented parallel to the mounting side 1a' and front side 1b'. This printed circuit board 20' accommodates the plug connectors 26' for the bus contacts 15', and is electrically connected via a further plug connector to main printed circuit boards 20' which are oriented perpendicular to the mounting side 1a' and front side 1b'.

The function of the various printed circuit boards 20 and 20' of main module 1 and of the expansion modules 2 will also be described in greater detail below.

Figure 3A:
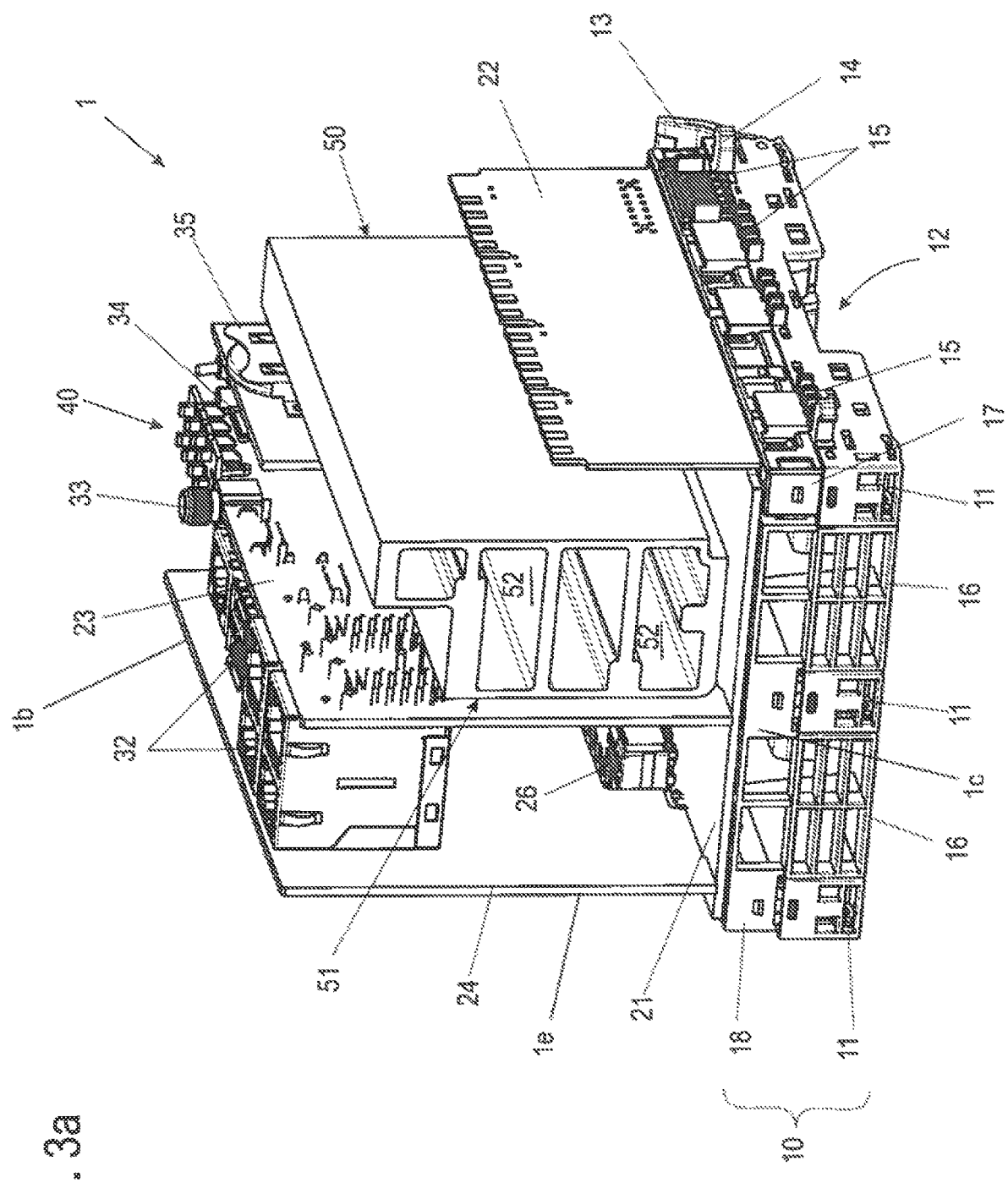
FIGS. 3a and 3b are front and rear perspective views, respectively, of an exemplary embodiment of a main module of a controller.
Figure 3B:
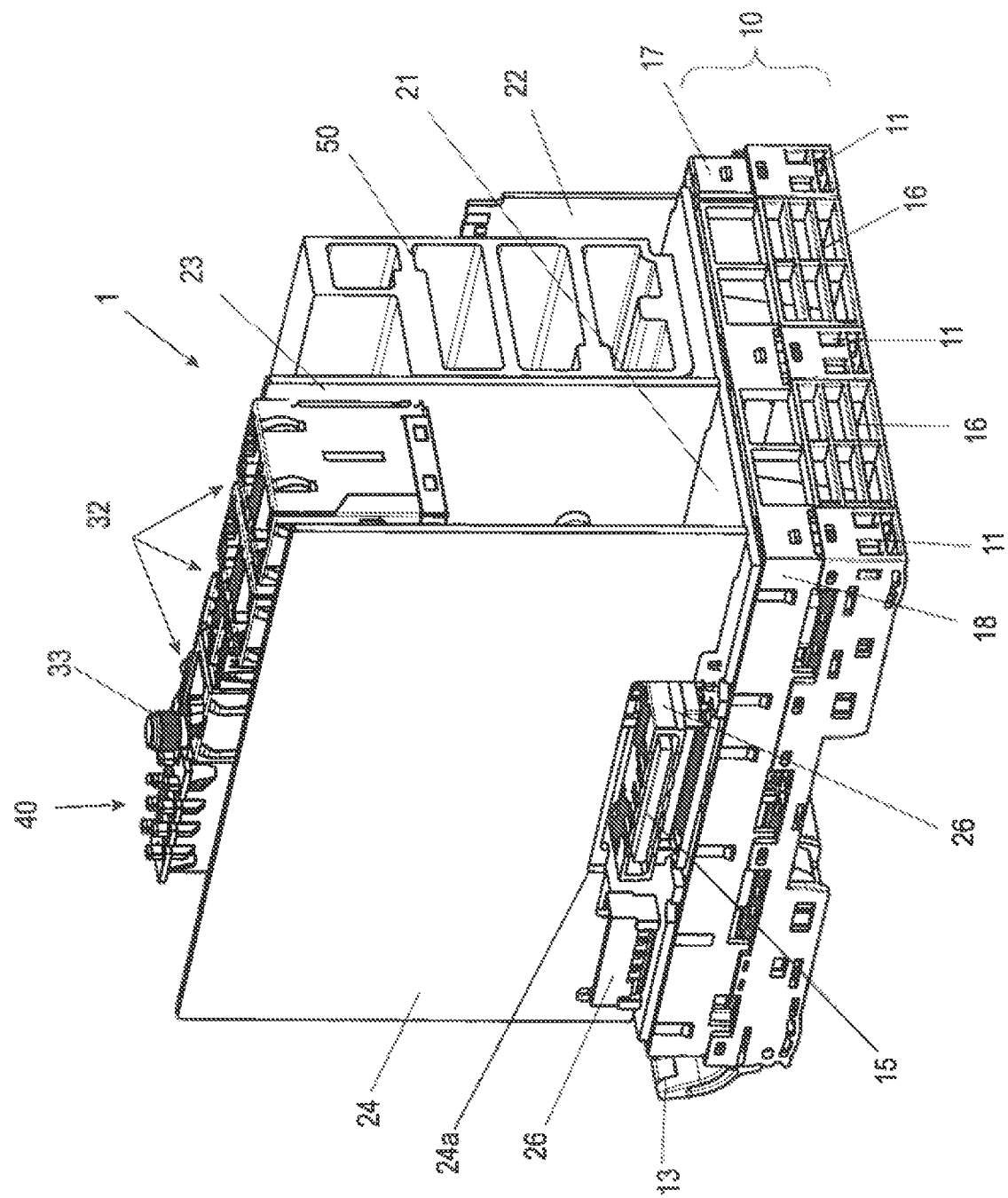
Figure 4A:
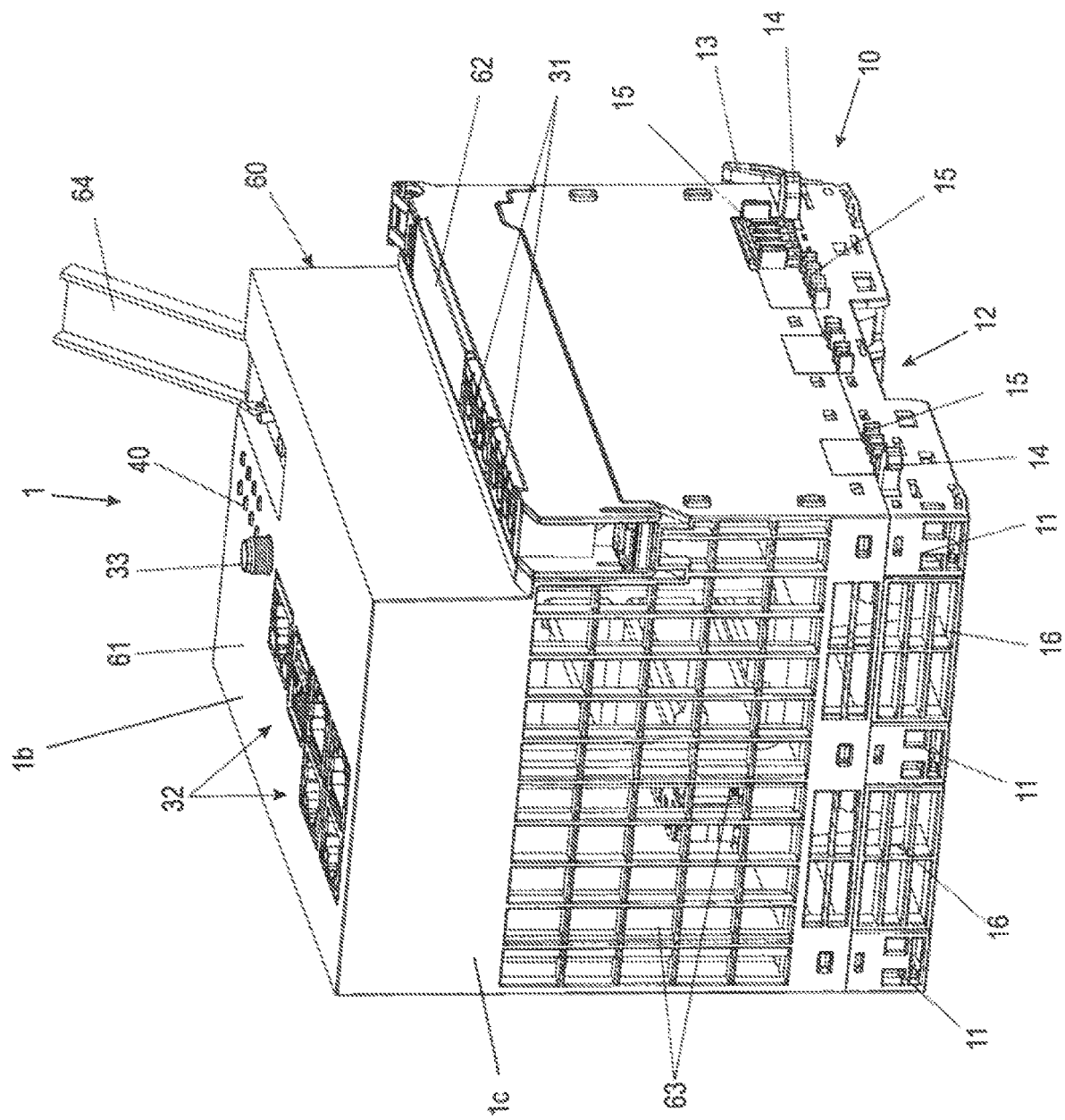
FIGS. 4a and 4b are front and rear perspective views of the main module of FIGS. 3a and 3b, respectively, with the housing cover attached.
Figure 4B:
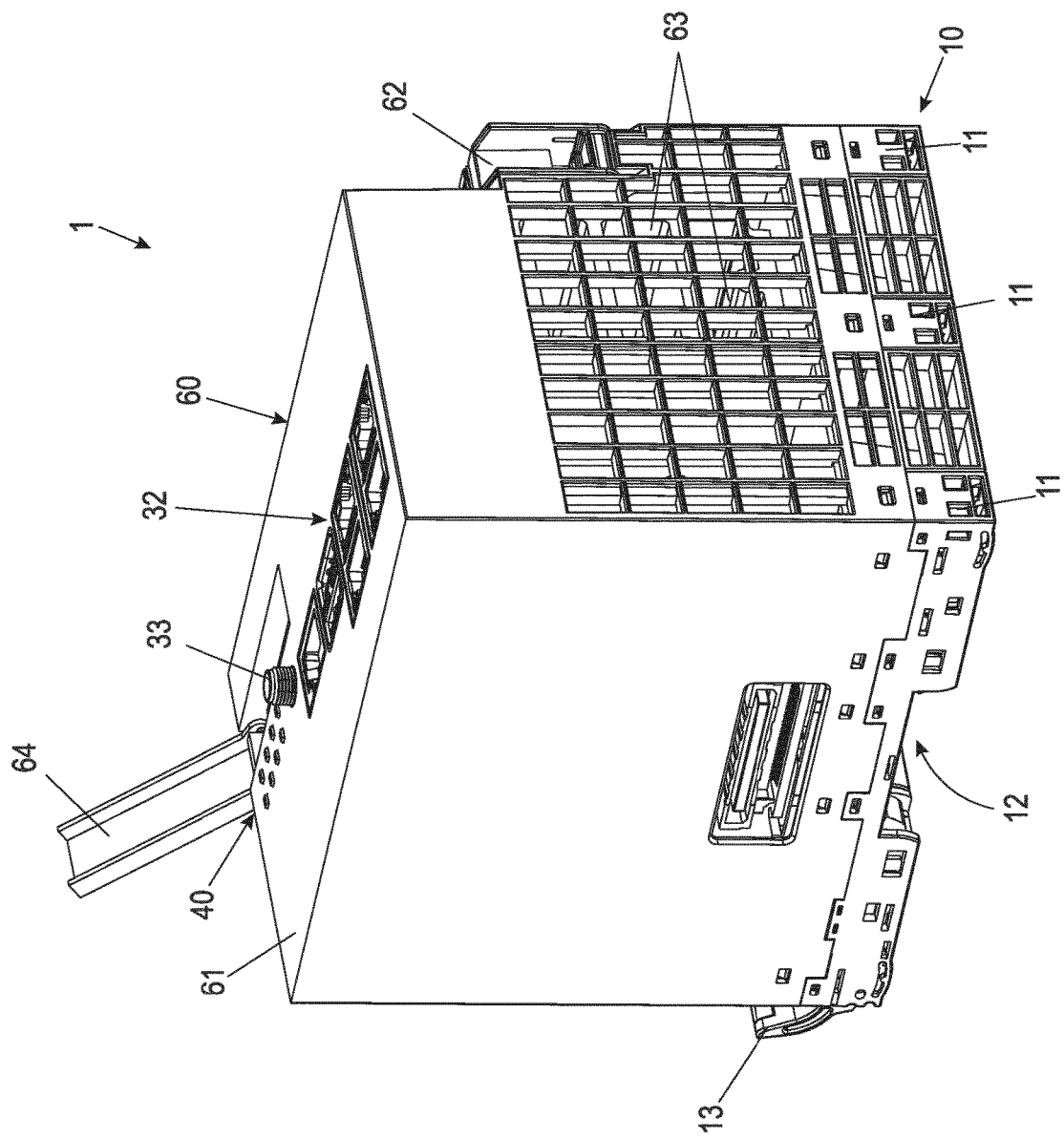
Figure 4C:
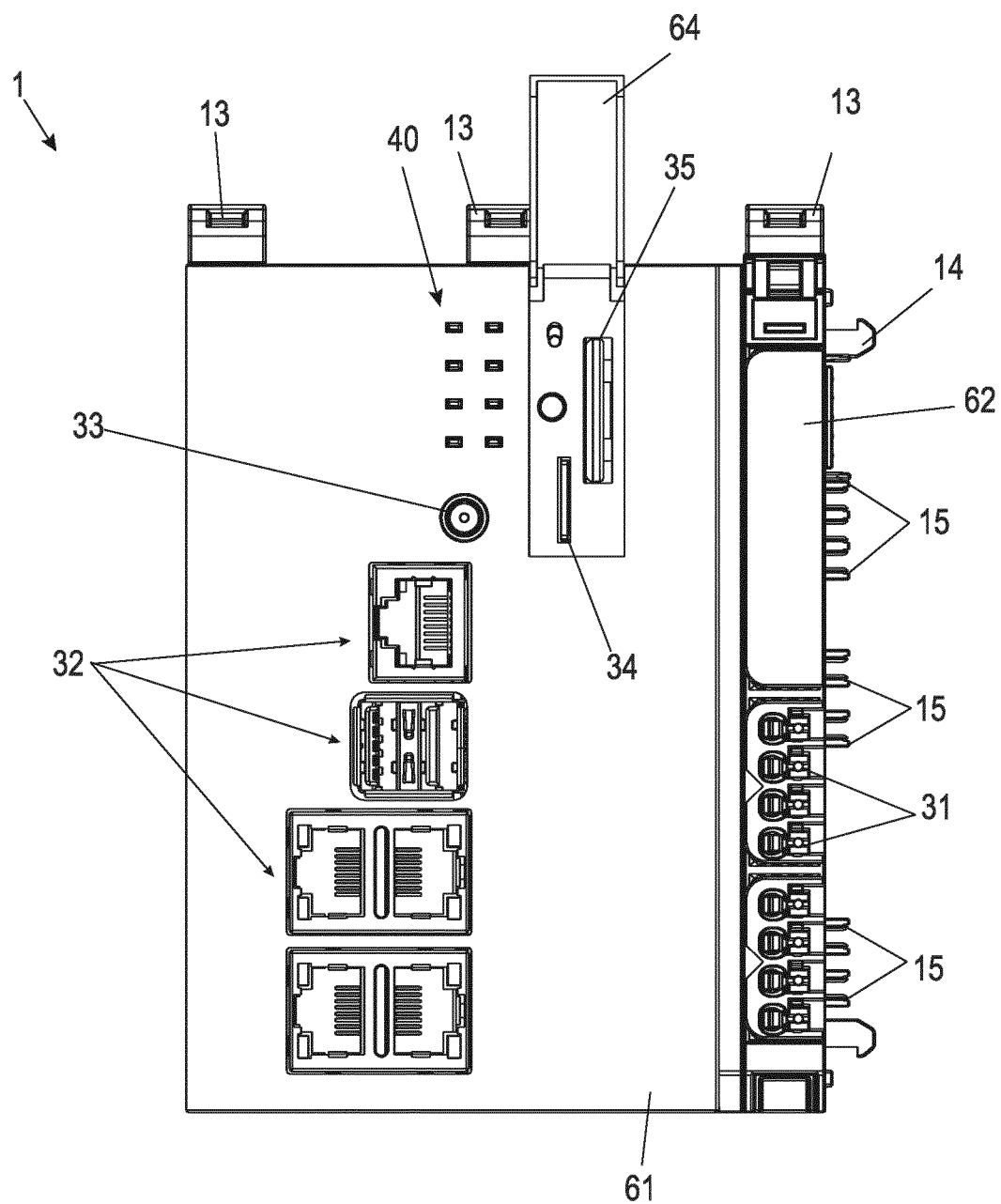
FIG. 4c is a top plan view of the main module of FIGS. 3a and 3b with the housing cover attached.

Another embodiment of a main module 1 of a controller is depicted in detail in FIGS. 3a, 3b and 4a-4c. FIGS. 3a and 3b show the main module 1 without the housing cover 60 fitted to obtain a view into the inner structure of the module. FIGS. 4a to 4c show various views of the main module 1 with the housing cover 60 fitted. FIGS. 3a, 3b and 4a, 4b are in each case perspective views from different perspectives and FIG. 4c is a plan view of the front side 1b of the main module 1.

The configuration of the base 10 of the main module 1 corresponds to that of the main modules 1 shown in FIGS. 1 and 2a to 2c.

The present main module 1 shown in FIGS. 3a-4c has a plurality of printed circuit boards 20, the arrangement and function of which are described in more detail below.

Firstly, a backplane bus printed circuit board 21 is arranged on the base frame 18 of the base 10 extending over the entire surface of the base frame 18. Towards the right side, the backplane bus printed circuit board 21 reaches slightly beyond the base frame 18 as far as the printed circuit board support 17. The printed circuit board support 17 supports a daughter printed circuit board 22, which is plugged into the printed circuit board support 17 and reaches as far as the bus contacts 15 on the right side of the main module 1.

The bus contacts 15, which provide a power supply and data connection to the input/output modules 3, are directly contacted by the daughter printed circuit board 22, which is perpendicular to the backplane bus printed circuit board 21 and is connected to it via a right-angle plug connector 26. The daughter printed circuit board 22 has at its upper end, printed circuit board edge connectors onto which the power supply terminals 31, which are arranged in the hinged strip 62 (shown in FIGS. 4a to 4c), are plugged.

The main module 1 is supplied with power supply voltage, generally a direct current voltage that is preferably 24V, via the power supply terminals 31. Electronic components are arranged on the daughter printed circuit board to provide the power supply to the main module 1, the input/output modules 3 and any expansion modules 2. Within the framework of this application, components arranged on printed circuit boards 20 are depicted only by way of example. The space on all printed circuit boards 20 that is not taken up by depicted components in the figures is available for electrical or electronic components. All printed circuit boards 20 can be equipped on one or, preferably, on both sides.

The backplane bus printed circuit board 21 includes a backplane bus for the main module 1 and any expansion modules 2. The backplane bus provides power supply lines and data lines that can be extended to a plugged-in expansion module 2 via the bus contacts 15'. The data lines form at least one standardized and/or proprietary data bus.

As shown in FIGS. 3a and 3b, a main printed circuit board 23 is situated on and perpendicular to the backplane bus printed circuit board 21, approximately in the center of the main module 1. The main printed circuit board 23 accommodates the essential functional elements of the main module 1, in particular one or more central processing units ("CPU"), one or more field programmable gate arrays ("FPGA"), memory modules such as random access memory ("RAM"), non-volatile RAM ("NVRAM"), a real-time clock ("RTC"), and also interface drivers for interface terminals 32, an antenna terminal 33 and switching and signal elements 40.

These interface terminals 32 and switching and signal elements 40 are arranged in the front upper region of the main printed circuit board 23. The switching and signal elements 40 and an antenna terminal 33 can be arranged on the border of the main printed circuit board 23 (shown in FIG. 3a), whereas the various interface terminals 32 are positioned on the side of the main printed circuit board 23 facing away from the daughter printed circuit board 22. In particular, RJ-45 terminals are provided as interface terminals 32, or D-SUB terminals, which are likewise used as field bus terminals. Furthermore, interface terminals 32 can be small formfactor pluggable ("SFP") network terminals, USB terminals, display terminals or also BL/SL terminals. The antenna terminal 33 can be, for example, an SMA high frequency terminal.

A heat sink 50 is positioned between the daughter printed circuit board 22 and the main printed circuit board 23. A cooling surface 51 facing the main printed circuit board 23 is in thermal contact with heat-producing components of the main printed circuit board 23, which are preferably arranged on the printed circuit board side facing the heat sink 50. All the heat-producing components, such as the CPU, the FPGAs, etc. can be cooled via the heat sink 50.

Referring again to FIGS. 2a to 2c, the heat sink 50 is attached to mounting domes 19 arranged in the base 10. The mounting domes 19 extend through an aperture in the backplane bus printed circuit board 21 such that the heat sink is connected directly to the base 10. Alternatively, the mounting domes 19 can end below the backplane bus printed circuit board 21 and a screw can pass through the backplane bus printed circuit board 21 and a spacing device can pass into the heat sink 50 such that the heat sink 50 is attached to the base 10 together with the backplane bus printed circuit board 21.

Referring again to FIGS. 3a and 3b, the upper cooling channel 52 adjacent to the front side 1b does not extend over the entire width of the heat sink 50, such that a free space is created on the rear side of the main printed circuit board 23. In this space, there is a small additional printed circuit board 25, which is oriented parallel to the main printed circuit board 23. This can be connected to the main printed circuit board 23 via soldering pins and/or plug connectors and can accommodate additional switching and signal elements 40 or terminals 30.

The additional printed circuit board 25 provides a memory card terminal 34 for accommodating a micro SD memory card as well as a battery terminal 35 for accommodating and contacting a back-up battery for powering the real time clock (RTC).

As can be seen in FIGS. 4a to 4c, the region in which the memory card terminal 34 and the battery are arranged can be covered by an access flap 64 to protect a memory card or battery against being inadvertently removed. The main cover 61 can include a display, or an aperture through which a display is accessible, which can have a touch function and provide a switching and signal element 40.

The interface terminals 32, which are positioned on the front side 1b in FIGS. 3a, 3b and 4a to 4c (also shown in FIGS. 5a-5d, 6a-6c, 7a-7e, 8a and 8b), can, in alternative configurations, be accessible in whole or in part from the lower side 1c of the main module 1, as is shown in the embodiment in FIGS. 1 and 2a to 2c.

On the left side 1e of the main module 1 shown in FIGS. 3a and 3b, an optional supplementary printed circuit board 24 is arranged parallel to the main printed circuit board 23 (also shown in FIGS. 2a to 2c and 9a to 9c). This supplementary printed circuit board 24 can have interface drivers and further interface terminals 32, which are then accessible on the front side 1b or lower side 1c of the main module 1. In this way, a larger variance of interfaces can be provided. The individual interface terminals 32 are positioned on the main printed circuit board 23 and the supplementary printed circuit board 24 in such a way that they utilize the installation space situated between each without interfering with one another. Preferably, components protruding into this installation space, and in particular the interface terminals 32, are arranged in a toothed and mutually engaging manner on the main printed circuit board 23 and the supplementary printed circuit board 24. The installation space can therefore be used optimally in a wide variety of equipment variants.

The supplementary printed circuit board 24 can additionally be used to provide particularly rapid input/output channels via FPGA or general-purpose input/output ("GPIO") modules with optional direct access to the backplane bus. In this way, specific input/output channels with switching times in the region of nanoseconds can be provided.

As shown in FIG. 3b, in a recess 24a of the supplementary printed circuit board 24 there is a plug contact 26 that is mounted on the backplane bus printed circuit board 21 to connect expansion modules 2 to the main module 1 via bus contacts 15. Besides relaying and distributing the backplane bus, the backplane bus printed circuit board 21 can also be used to accommodate back-up capacitors for smoothing and supporting the power supply line of the backplane bus. It is also conceivable to arrange the back-up battery of the real time clock (RTC), which is on the additional printed circuit board 25 in FIG. 3a, on the upper or lower side of the backplane bus printed circuit board 21 as shown in FIG. 7e. For both the housing cover 60 or the base 10, a flap or covering can be provided in an appropriate location through which the back-up battery is accessible and can be replaced. A drawer can also be provided, into which the back-up battery is inserted such that it can be easily replaced.

Figure 5A:
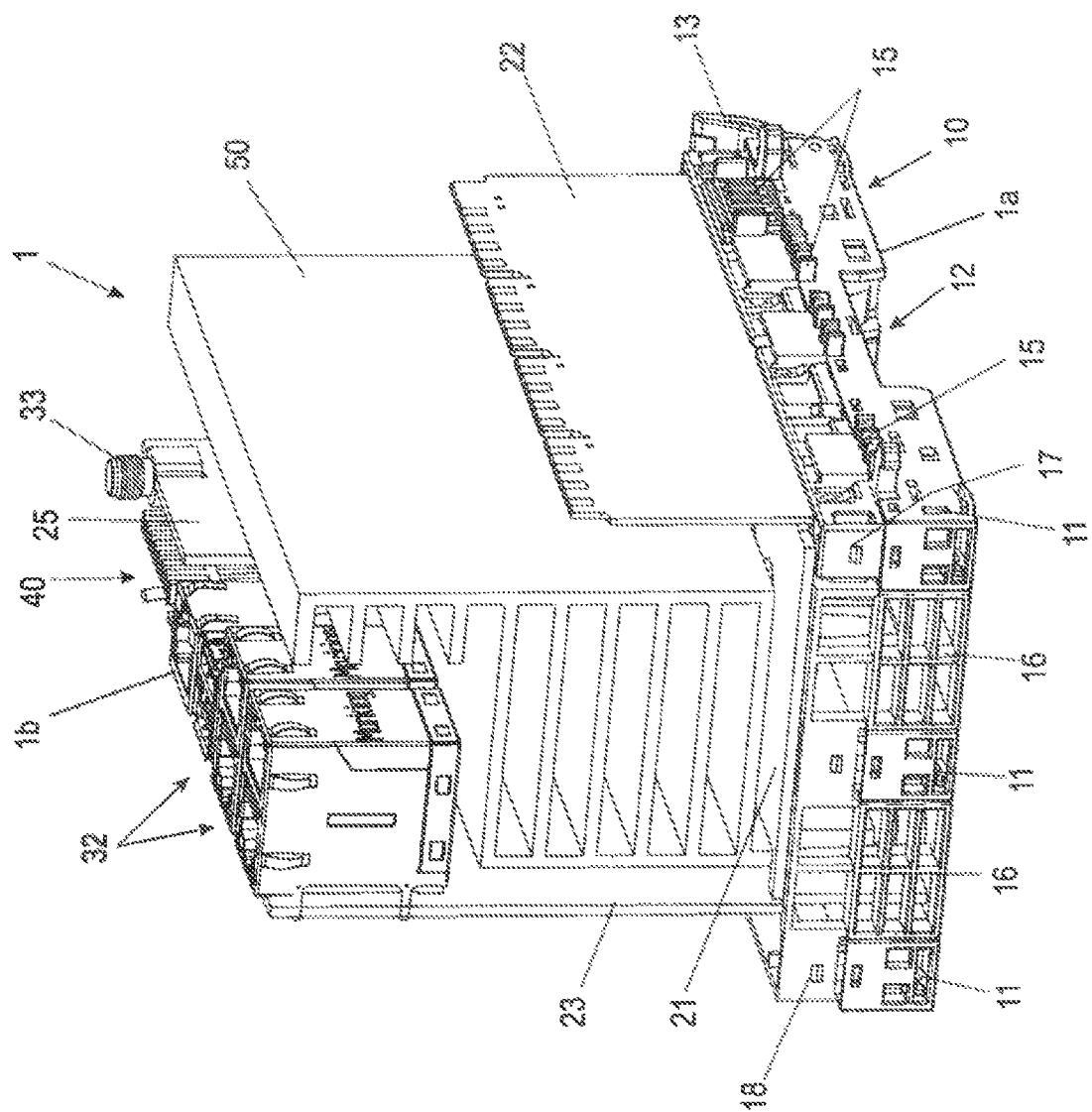
FIGS. 5a-5d are various perspective views, respectively, of a further exemplary embodiment of a main module of a controller, depicted without the housing cover and partially without the base.
Figure 5B:
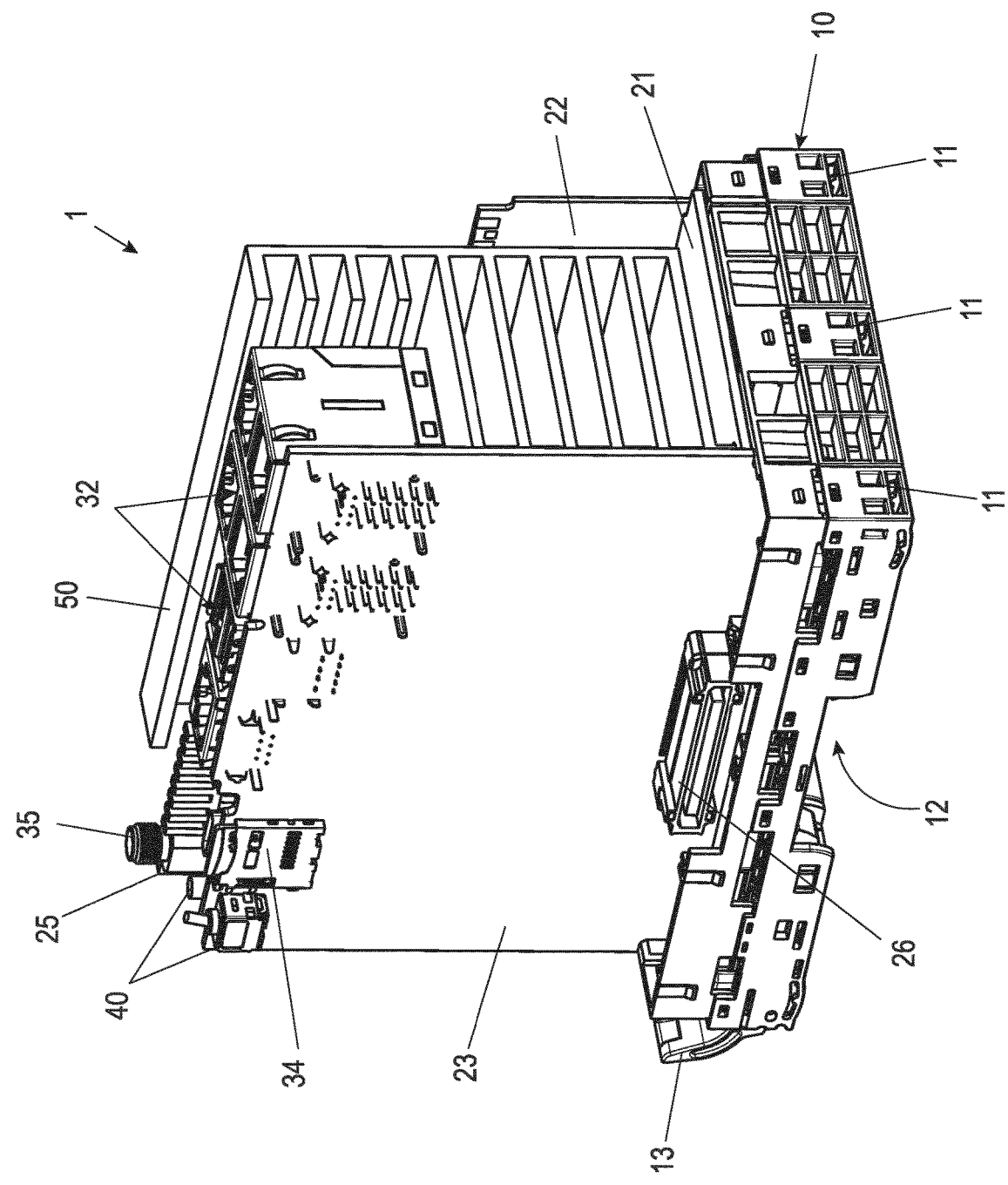
Figure 5C:
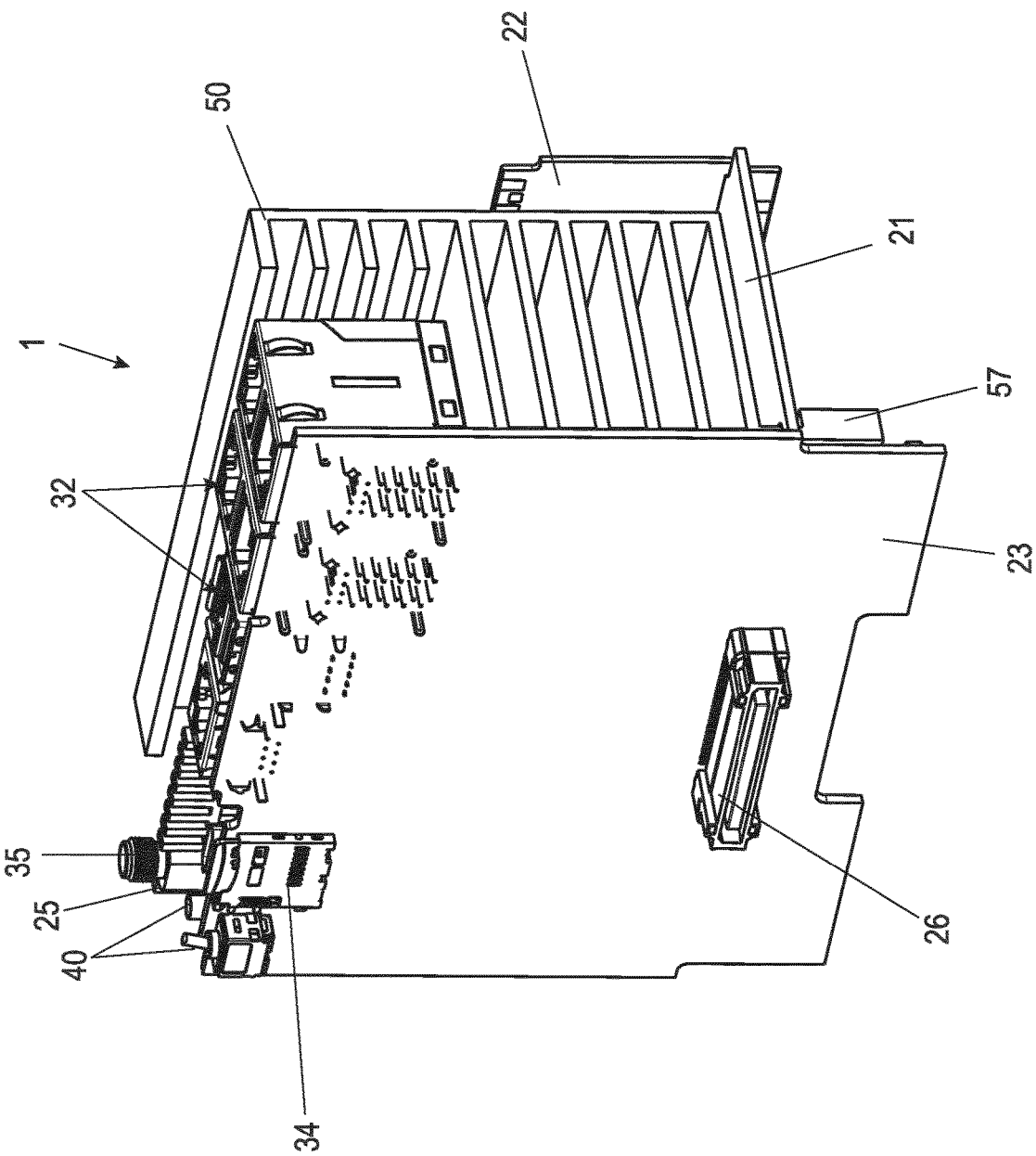
Figure 5D:
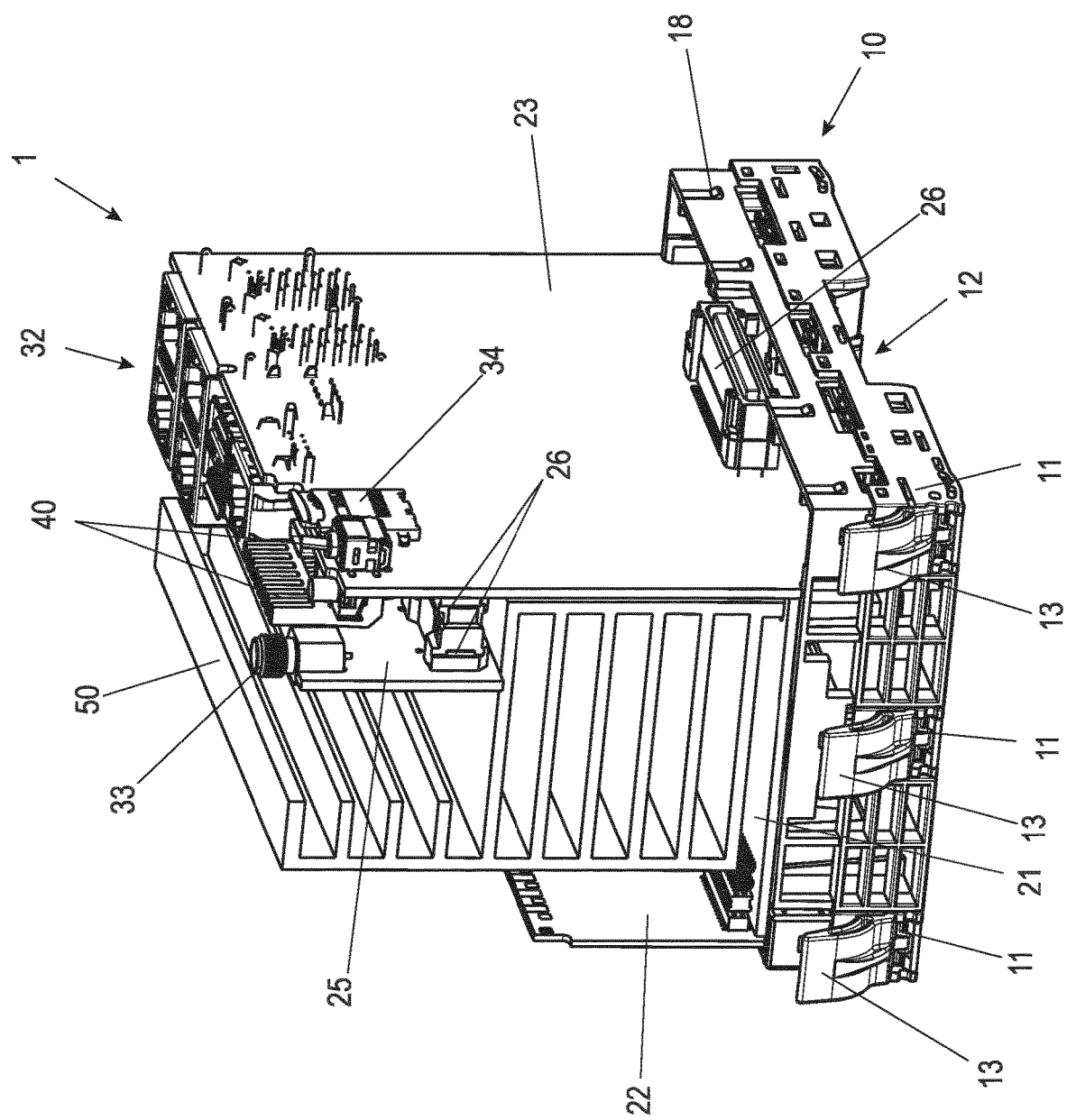
Figure 6A:
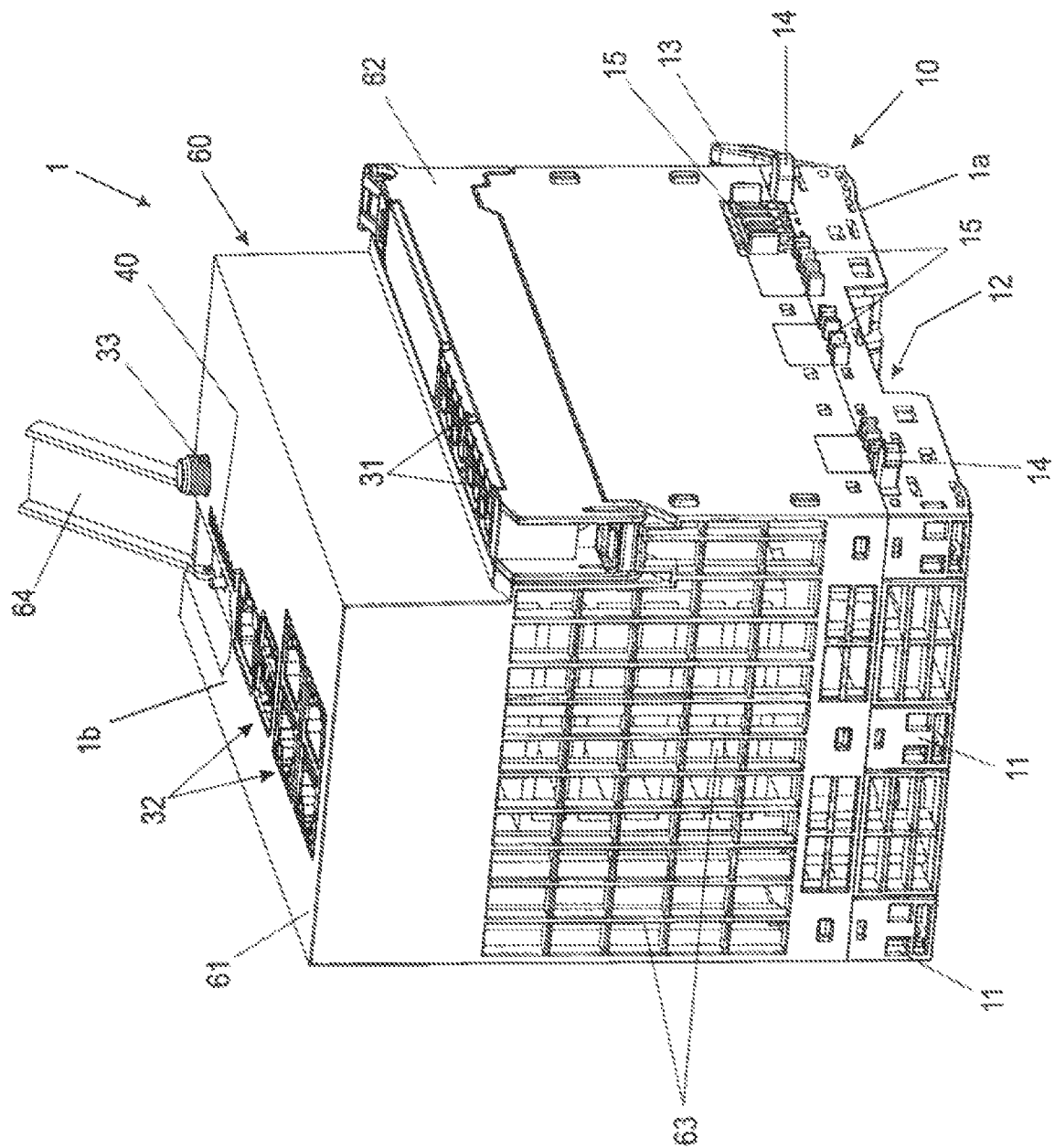
FIGS. 6a and 6b are front and rear perspective views, respectively, of the main module from FIGS. 5a to 5d with the housing cover attached.
Figure 6B:
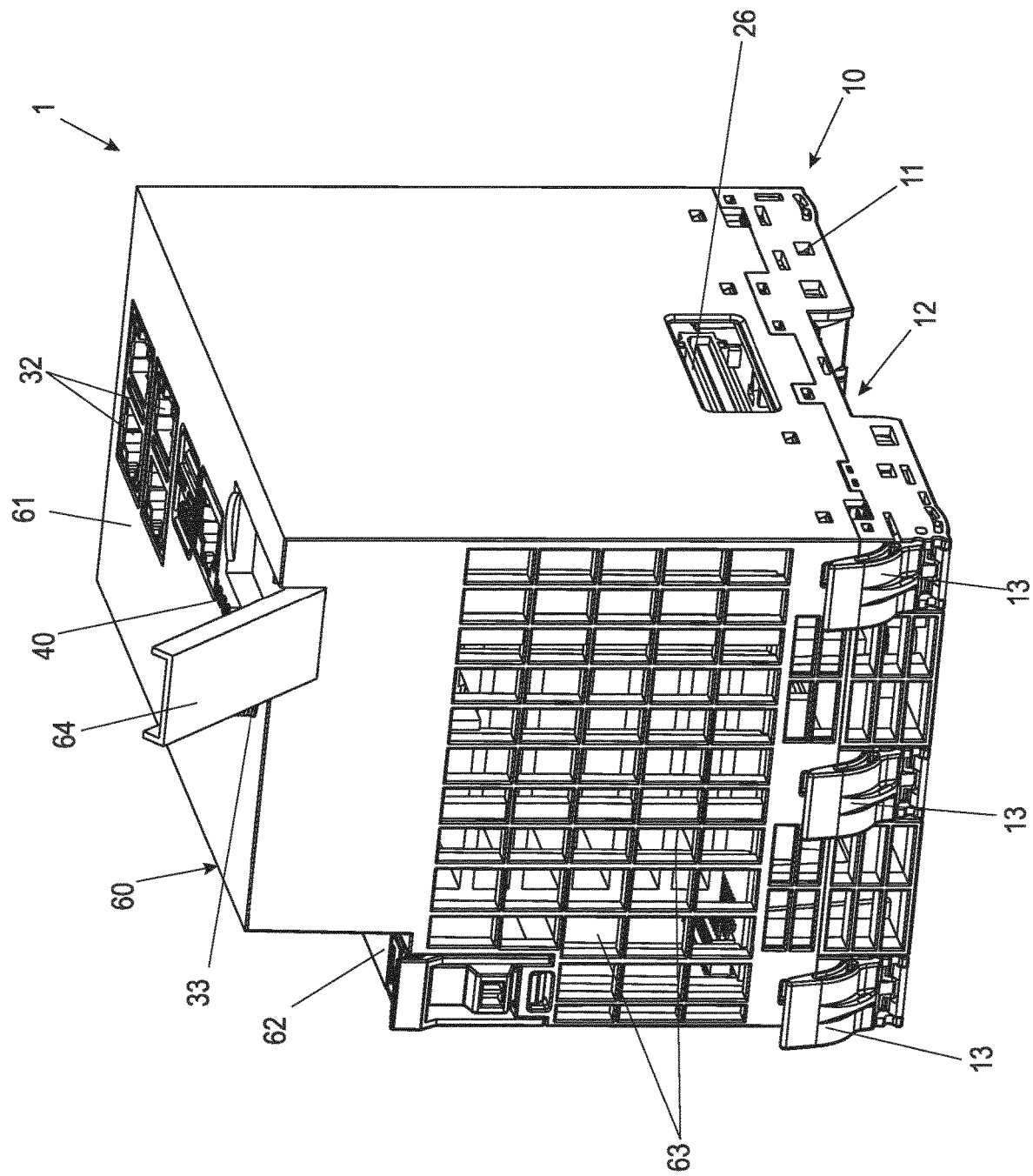
Figure 6C:
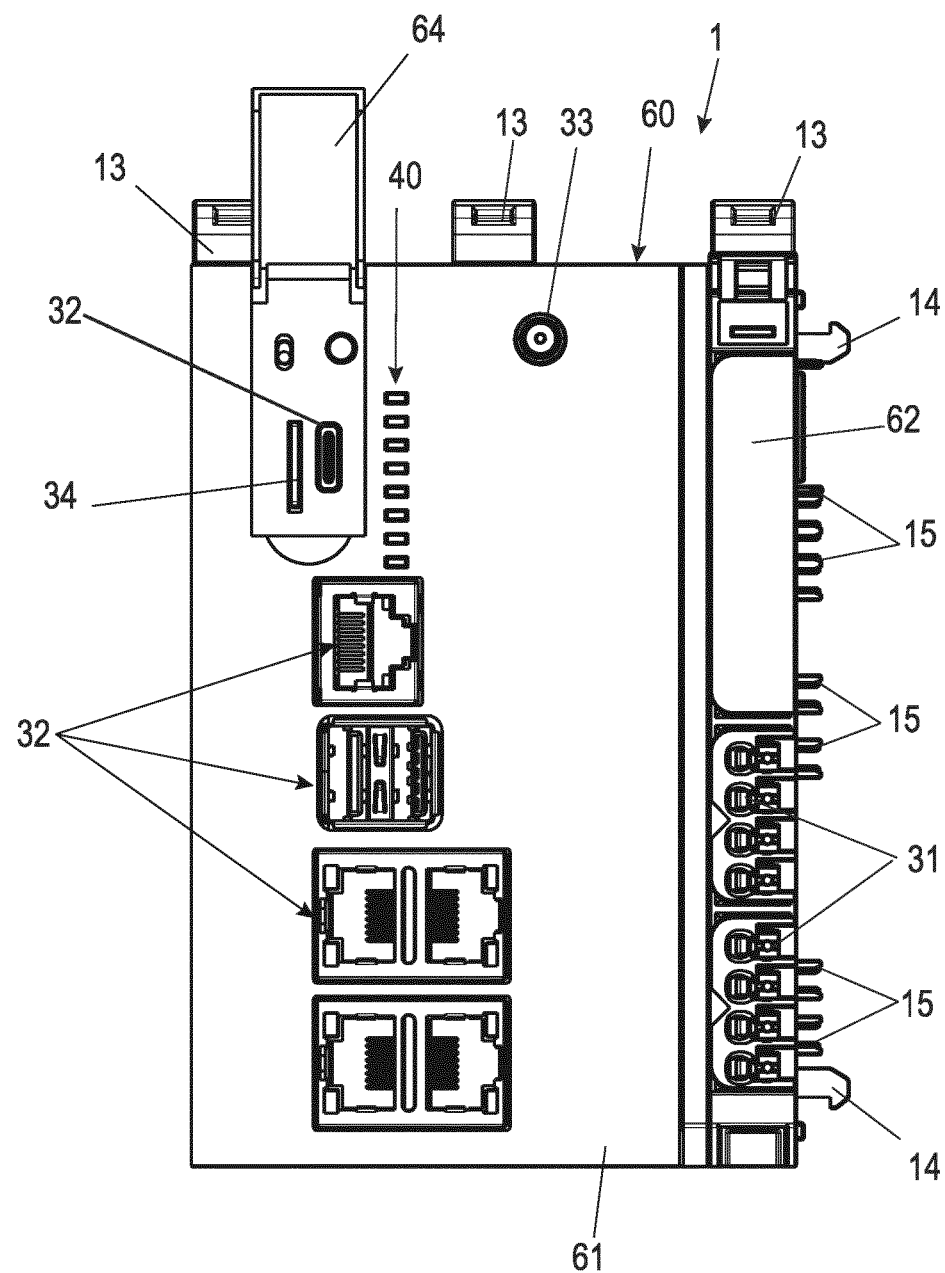
FIG. 6c is a top plan view of the main module of FIGS. 5a to 5d with the housing cover attached.

A further embodiment of a main module 1 of a control system is depicted in FIGS. 5a to 5d and 6a to 6c. FIGS. 5a to 5d show the main module 1 without the housing cover 60 fitted thereon, whereas FIGS. 6a to 6c show the main module 1 with the housing cover 60.

The base 10 of the main module 1 is constructed as in the previous exemplary embodiments described above. Any differences will be described below.

Other than the daughter printed circuit board 22, the backplane bus printed circuit board 21, or additional printed circuit boards 25, only one main printed circuit board 23, and no supplementary printed circuit board 24, is provided.

To make optimum use of the available space, the main printed circuit board 23 is arranged in the region of the left side 1e of the main module 1. The switching and signal elements 40 in turn are positioned along a section of the upper end of the main printed circuit board 23. The main printed circuit board 23 is arranged laterally in the main module 1, and the interface terminals 32 which protrude to the side from the main printed circuit board 23 (as with RJ-45 and USB terminals) are arranged to the right of the main printed circuit board 23. In a region below these, the heat sink 50 extends to the main printed circuit board 23 to thermally connect heat-emitting components of the main printed circuit board to the heat sink 50 to cool the components. The upper region of the heat sink 50 is configured to provide space for the interface terminals 32 and the additional printed circuit board 25. If there is low demand for cooling, the section of the heat sink 50 that is located beside the interface terminals 32 can optionally be removed so that there is more space for the additional printed circuit board 25 or space for an additional printed circuit board 25 oriented parallel to the front side 1b.

A further difference shown in FIGS. 5a-6c, as compared to the previous exemplary embodiments, relates to the configuration of the printed circuit boards 20 in the region of the connection between the backplane bus printed circuit board 21 and the main printed circuit board 23.

As can be seen from FIG. 5b, on the left side 1e of the main module 1, the backplane bus printed circuit board 21 has a plug contact 26 which can transfer the backplane bus to pluggable expansion modules 2. The backplane bus printed circuit board 21, however, is not extended to the edge of the base frame 18 in this region, but rather, it ends in front of the main printed circuit board 23. As a result, the main printed circuit board 23 can be lengthened downward into the base 10, with the result that more equipment area is available. The region of the plug connector to the expansion modules 2 in this case is recessed. In FIG. 5c, the main module 1 is reproduced from the same perspective as in FIG. 5b, however the base 10 is removed to depict the entire height of the main printed circuit board 23. This figure furthermore shows the heat sink 50 mounting foot 57 which protrudes into the base 10 region and serves to attach the heat sink to the base.

In addition to the plug connector 26 for relaying the backplane bus to the expansion modules 2, a right-angle connector, not shown, connects and transfers the backplane bus from the main printed circuit board 23 to the backplane bus printed circuit board 21. In an alternative configuration, both plug connectors can be combined in such a way that the main printed circuit board 23 has on the front 1b and rear 1a sides a plug connector that interacts with a corresponding mating plug connector on the backplane bus printed circuit board 21 and relays the backplane bus to the expansion module 2. Such an arrangement of plug connectors is also referred to as a 180° plug connector.

The larger surface area of the main printed circuit board 23 shown in FIG. 5c makes it possible to accommodate the essential functions on one printed circuit board, and thus the supplementary printed circuit board 24 can be omitted. For applications involving compact housing dimensions the smaller printed circuit board shown in previous embodiments is provided. However, the variant shown in FIG. 5c constitutes an inexpensive version of the control system. Also, having all essential components on the main printed circuit board 23 allows high frequency pulsed signals to be conducted via a few plug connectors, which results in good signal flow and high pulse frequencies. Removing the supplementary printed circuit board 24 also has a cost-reducing effect on the system, which can be done if only a small number of terminals and low article variance are required.

Referring again to FIGS. 5a-6c, a further difference compared to the previously shown exemplary embodiments lies in the arrangement of terminals 30 and switching and signal elements 40 to the various printed circuit boards 20. In the present example, the antenna terminal 33 is arranged on the additional printed circuit board 25, which is advantageous when the antenna terminal 33 and/or further interface terminals 32 are not included in the basic equipment of the main module 1, but rather can be added subsequently in an appropriate manner by retrofitting the additional printed circuit board 25.

In this embodiment, the memory card terminal 34 is also arranged on the main printed circuit board 23. All the terminals and functional modules which are necessary for operation of the main module can be arranged on the main printed circuit board 23, the backplane bus printed circuit board 21, or the daughter printed circuit board 22. Optional features such as the antenna terminal 33, for example, can then be retrofitted via the additional printed circuit board. As has already been mentioned in connection with the previous exemplary embodiment, a back-up battery for a real time clock of the system can be arranged on the backplane bus printed circuit board 21.

Figure 7A:
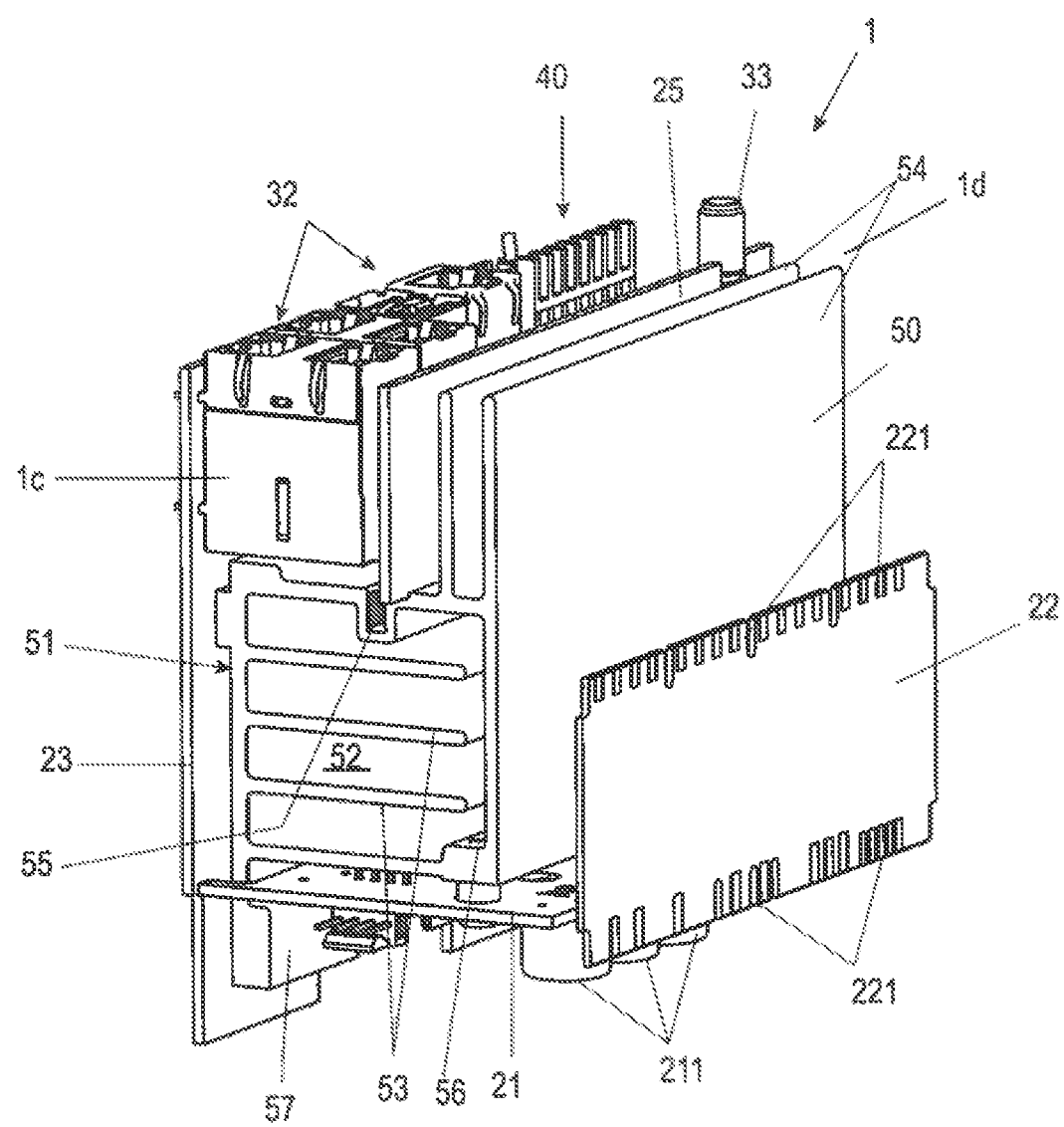
FIGS. 7a and 7b are perspective views, respectively, of a further exemplary embodiment of a main module of a controller without the housing cover and without the base.
Figure 7B:
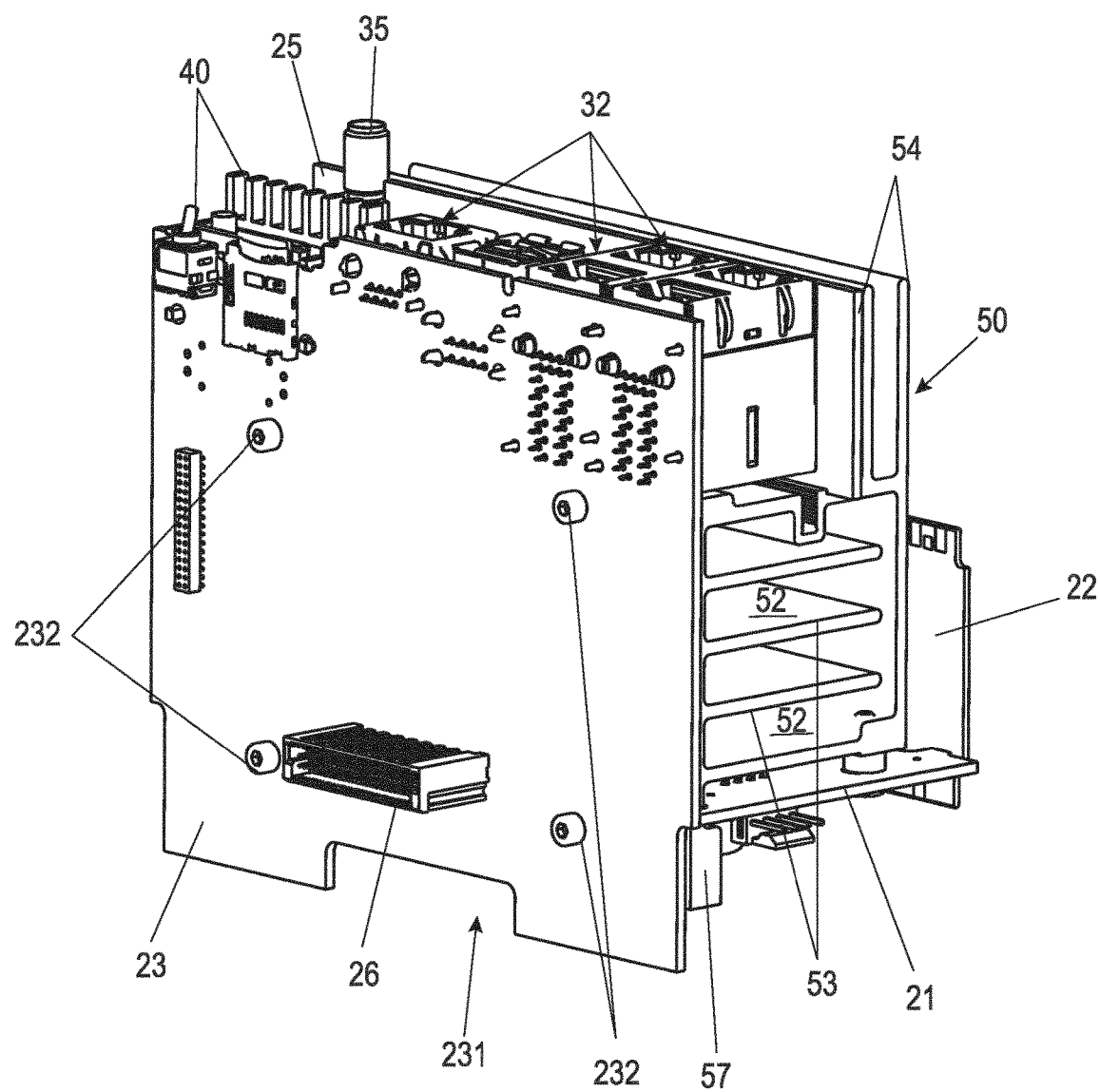
Figure 7C:
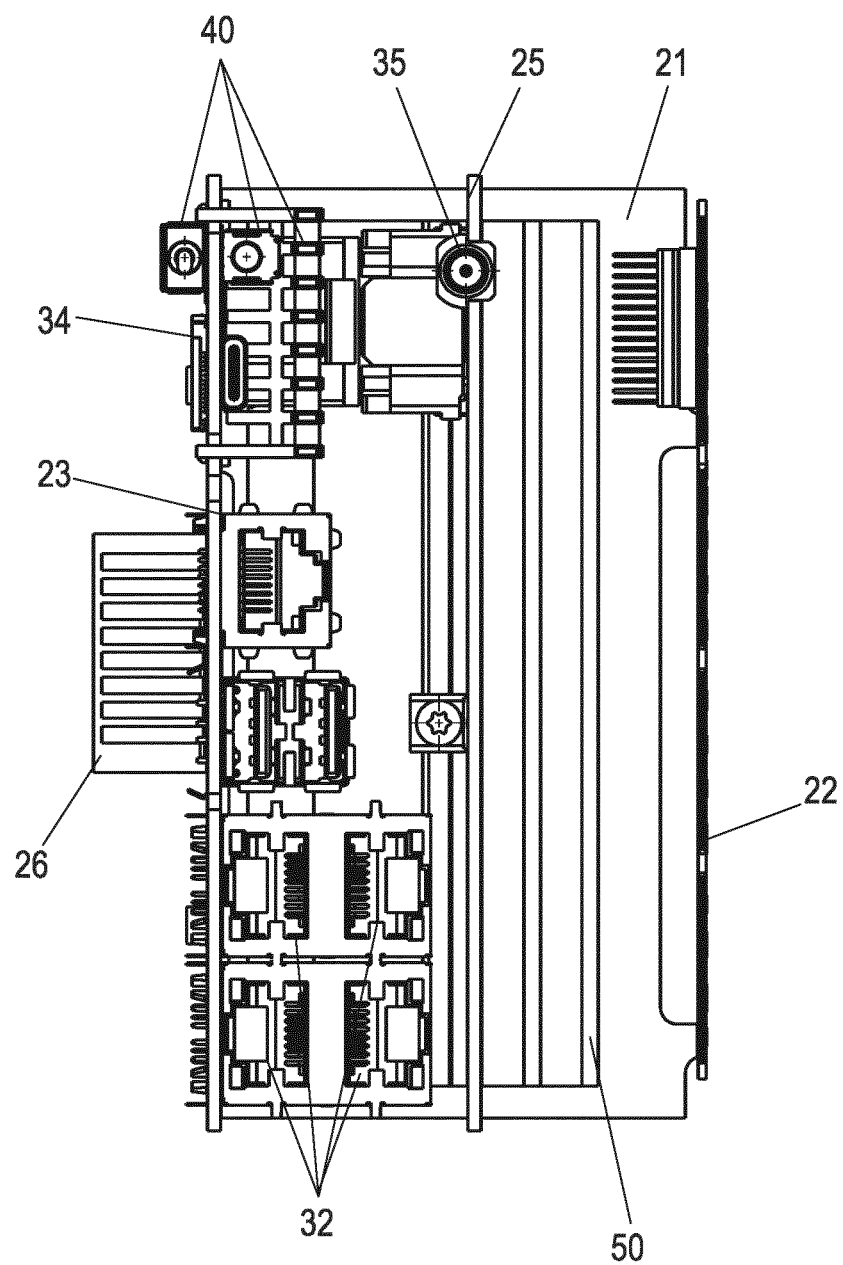
FIGS. 7c, 7d and 7e are top, front and bottom views, respectively of the embodiment of FIGS. 7a and 7b.
Figure 7D:
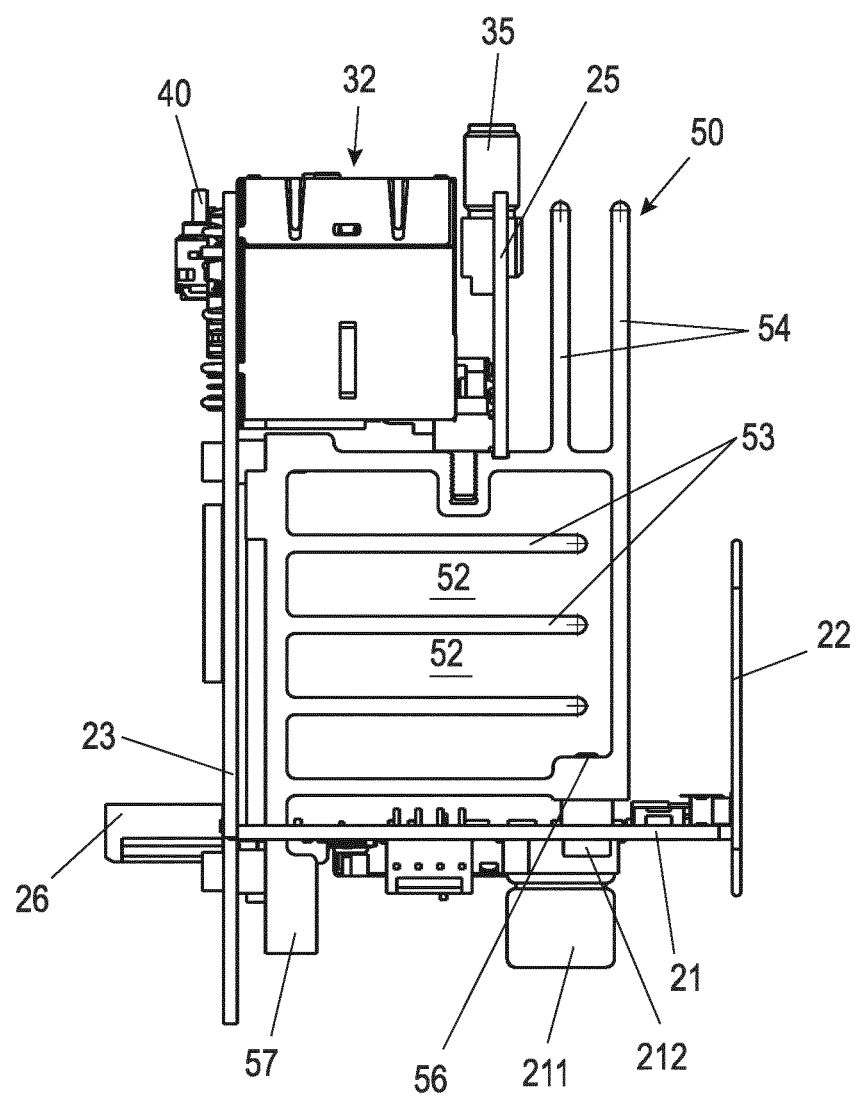
Figure 7E:
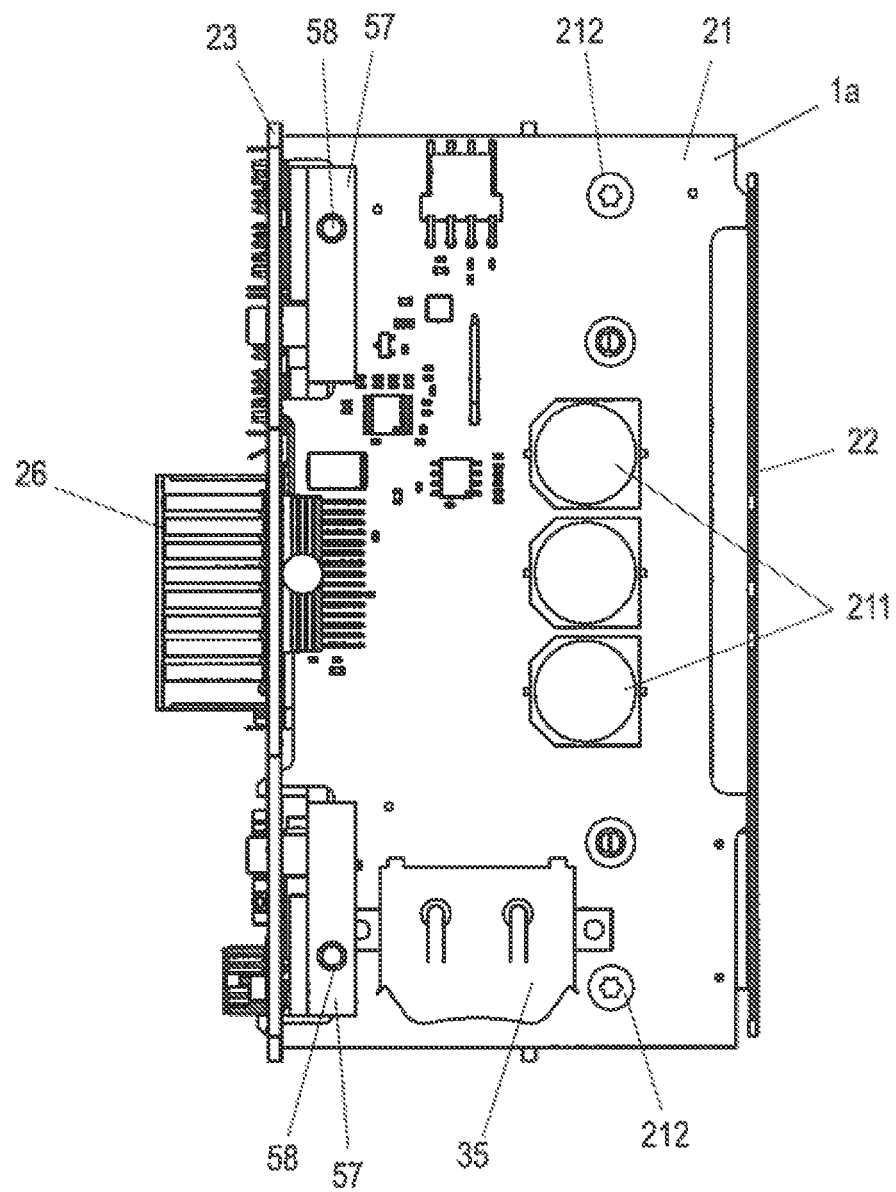
Figure 8A:
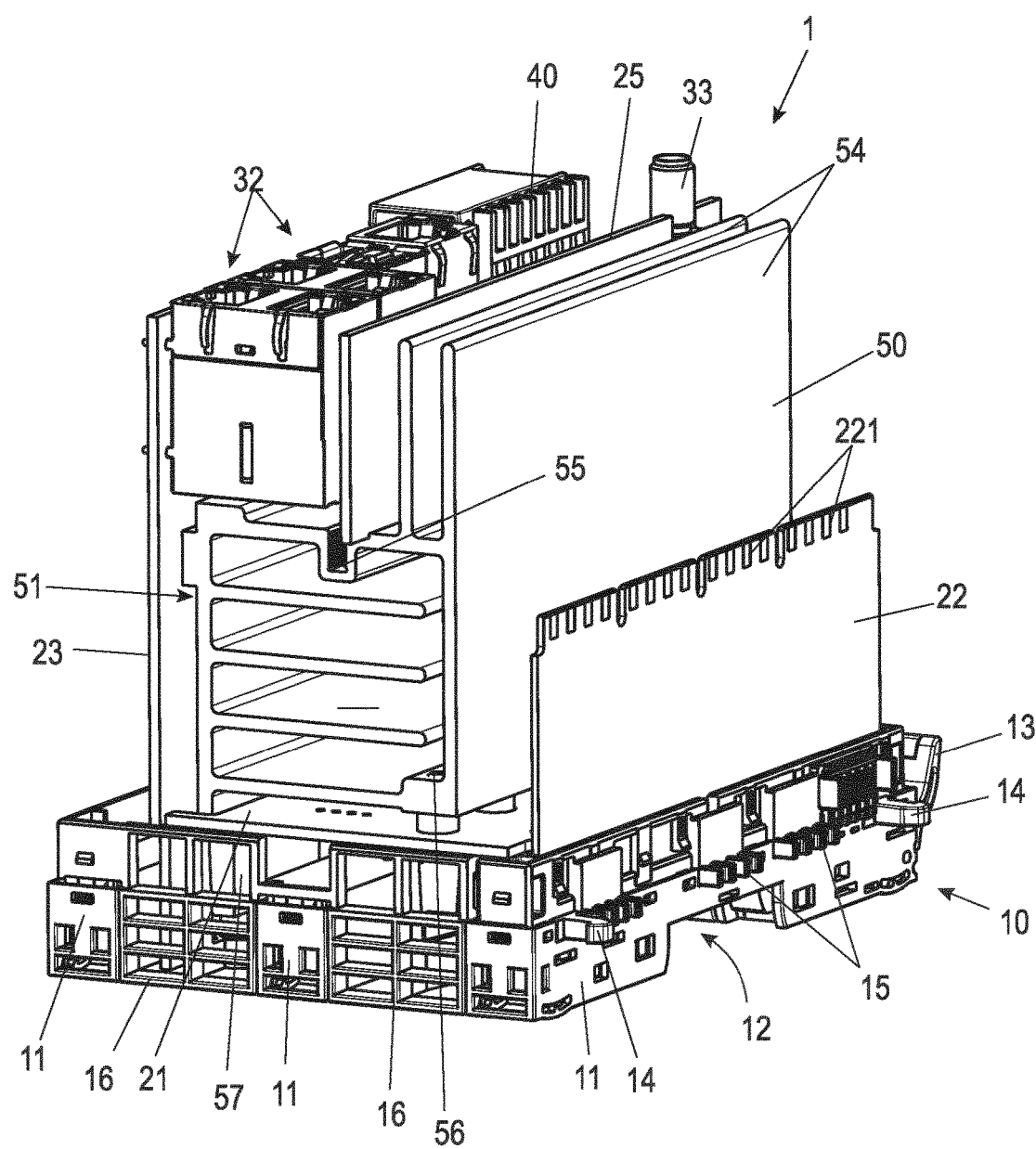
FIGS. 8a and 8b are perspective views, respectively, of the main module from FIGS. 7a to 7e with the base or base and housing cover attached.
Figure 8B:
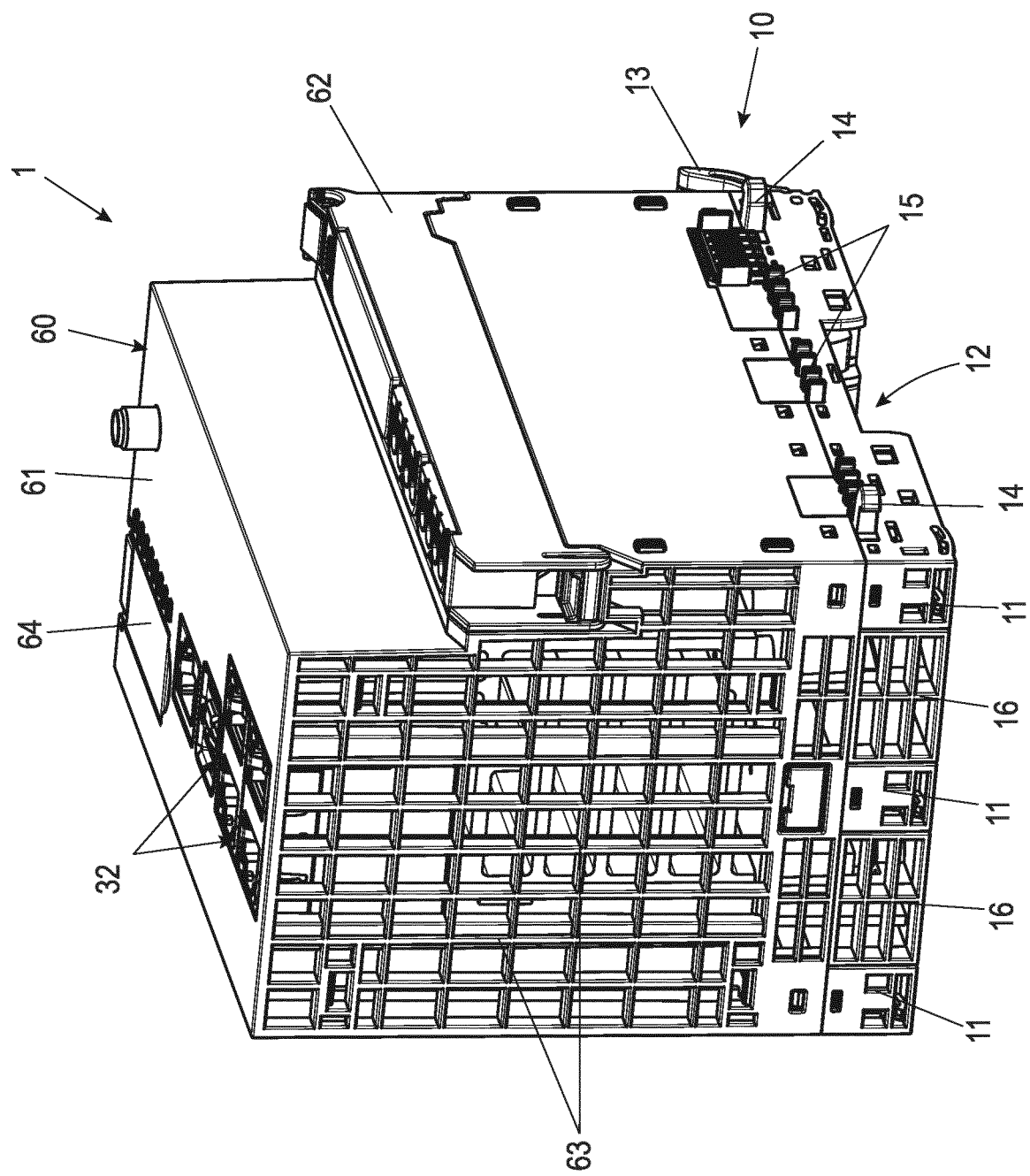

A further exemplary embodiment of a main module 1 of a controller is depicted in various views in FIGS. 7a to 7e and 8a and 8b. FIGS. 7a to 7e show the main module 1 without the housing. FIG. 8a shows the main module arrangement of FIGS. 7a to 7e inserted into a base 10. Finally, the complete main module 1 with base 10 and housing cover 60 fitted thereon is depicted in FIG. 8b. FIGS. 7a and 7b are isometric oblique views of the main module 1, which is shown without the base 10 and without the housing cover 60. FIG. 7c shows a top plan view of the main module 1, FIG. 7d shows a front plan view, and FIG. 7e shows a bottom plan view of the mounting side 1a of the main module 1 without the base 10.

As regards the basic structure, the main module 1 shown in FIGS. 7a to 7e, 8a, and 8b is constructed like the main module 1 described in previous figures. In particular, there are a plurality of printed circuit boards, specifically a backplane bus printed circuit board 21, a daughter printed circuit board 22, a main printed circuit board 23 and an additional printed circuit board 25. The backplane bus printed circuit board 21 is situated, as in the previous exemplary embodiments, such that it will be parallel to a DIN rail when the main module 1 is latched thereto. The backplane bus printed circuit board 21 is also situated on the base 10 which has three latching supports 11 spaced apart from one another by spacing elements 16. The main printed circuit board 23, the daughter printed circuit board 22 and the additional printed circuit board 25 are arranged perpendicular to the backplane bus printed circuit board 21.

The heat sink 50 is arranged centrally in the main module 1 and, other than cooling components of the main module 1, it serves to hold several of the printed circuit boards. The heat sink 50 thus constitutes the central and supporting element of the main module 1. It extends over the entire main module 1 from the lower side 1c to the upper side 1d.

The cooling channels 52 of the heat sink 50, defined by inner fins 53, also extend in this direction. When the main module 1 is mounted on a DIN rail, the cooling channels 52 extend perpendicular to the lower side 1c, so that a cooling air current enters through the cooling channels 52 by convection. If necessary, as described in connection with the exemplary embodiment in FIG. 1, a fan can be fitted on the outside of the housing 60 to increase an air current through the ventilation breakouts 63 and the cooling channels 52.

In a lower region of the heat sink 50, which takes up approximately half or slightly more than half of the installation height, the inner cooling fins 53 are configured parallel to the backplane of the printed circuit board 21. Thus, they dissipate heat from the cooling surface 51, which runs parallel to the main printed circuit board 23. In this example, the inner fins 53 do not reach as far as the opposite wall of the heat sink 50, which simplifies manufacturing thereof in an extrusion die-casting process.

Electronic components, which are arranged on the side of the main printed circuit board 23 that faces the heat sink 50, are in thermal contact with this cooling surface 51. The cooling surface 51 in this case can be formed in a stepped manner and can have plateaus at different heights to adequately contact structural elements of the main printed circuit board which are at different heights.

In an upper region of the heat sink 50, the otherwise parallelepipedal configuration of the heat sink 50 is adjusted to provide space for the interface terminals 32 and/or switching and signal elements 40, which are arranged on the main printed circuit board 23. Outer cooling fins 54 are oriented parallel to the main printed circuit board 23 in the remaining section of the heat sink 50. Thus, they are also parallel to the additional printed circuit board 25, which, for example, accommodates modules for wireless communication and supports an antenna terminal 33. Elements which are to be cooled on the additional printed circuit board 25 can be coupled to the adjacent cooling fins 54. There is an attachment groove 55 in the heat sink 50 in this region to which the additional printed circuit board 25 is attached.

Referring still to FIGS. 7a-8b, and as in previously described embodiments, the main printed circuit board 23 is mounted on the heat sink 50. By way of example, in FIG. 7b attachment screws 232 can be seen, which pass through the main printed circuit board 23 and are screwed into corresponding threaded bores in the heat sink 50. Moreover, as shown in FIG. 7a, the backplane bus printed circuit board 21 is screwed to the heat sink 50 via bores 56. The backplane bus printed circuit board 21, the main printed circuit board 23, and the additional printed circuit board 25, together with the heat sink 50, form a pre-attached assembly which is electrically functional and which is inserted as a whole into the base 10 for mounting.

To mount the assembly unit in the base 10, the heat sink 50 mounting feet 57, in a manner comparable to the exemplary embodiment in FIGS. 5a-5d and 6a-6c, protrude into a region of the base 10 through a recess at the edge of the backplane bus printed circuit board 21. The base preferably includes guides for the mounting feet 57 which receive the inserted heat sink 50 laterally in a form-fitting manner. As can be seen in FIG. 7b, the main printed circuit board 23 extends beyond the plane of the backplane bus printed circuit board 21 downward in the direction of the base 10 and protrudes into the base 10 like the mounting feet 57. In this way, additional equipment space is created on the main printed circuit board 23, without enlarging the installation height of the main module 1 (i.e. the height above the DIN rail).

There is a recess 231 in the lower portion of the main printed circuit board shown in FIG. 7b. The view of the lower side of the backplane bus printed circuit board 21 in FIG. 7e shows the downwardly extended mounting feet 57 with a mounting bore 58, which allows the inserted heat sink 50 to be screwed to the base from below. In this view, structural elements 211 of the backplane bus printed circuit board 21 protrude into and use space of the base 10. Furthermore, there are attachment screws 212, with which the backplane bus printed circuit board 21 is screwed to the heat sink 50.

Figure 9A:
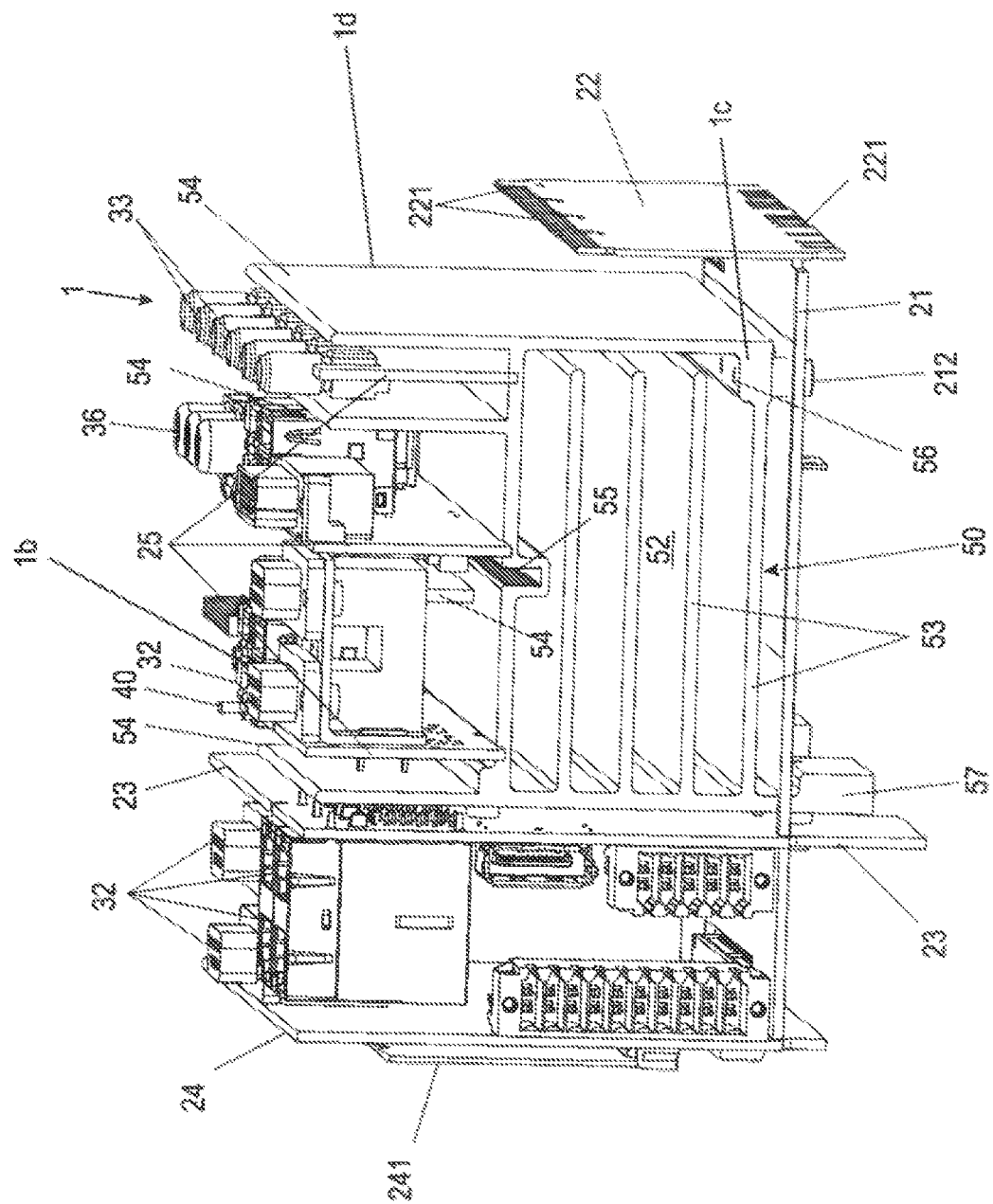
FIG. 9a is an isometric view of a further exemplary embodiment of a main module of a controller without the housing cover and without the base.

A further embodiment of a main module 1 of a controller is depicted in FIG. 9a. In a comparable manner to FIG. 8a, an oblique perspective view of the main module 1 is shown, without the base 10 or housing cover 60 included.

The embodiment depicted in FIG. 9a corresponds to that shown in FIGS. 7a-7e and 8a, 8b, in particular in relation to mounting the heat sink 50. There are mounting feet 57 which protrude downward into the base 10, and the main printed circuit board 23 and the backplane bus printed circuit board 21 are connected to the heat sink 50 via attachment screws 212.

Also, as in the case of the previously described embodiment of FIGS. 7a-8b, the heat sink 50 has inner cooling fins 53 arranged parallel to the backplane bus printed circuit board 21 in a lower section of the heat sink, and outer cooling fins 54 oriented perpendicular to the backplane bus printed circuit board 21 in the upper part of the heat sink 50.

In contrast to the previously described exemplary embodiment, the heat sink 50 is wider from left to right with a total of four outer cooling fins 54 arranged parallel to the main printed circuit board 23. The fins extend over the entire width of the heat sink 50 from the lower side 1c to the upper side 1d. There are three intermediate spaces between the cooling fins 54, each of which include an additional printed circuit board 25. To attach at least some of these additional printed circuit boards 25, there is an attachment groove 55 in the heat sink 50 into which attachment screws of varying potential positions can be screwed.

To make electrical connections between the main printed circuit board 23 and the additional printed circuit boards 25, or between various ones of the additional printed circuit boards 25, three of the four mentioned outer fins 54 do not extend over the entire extent of the heat sink 50 from the lower side 1c to the upper side 1d. Specifically, the first and third cooling fins 54 shown from left to right in FIG. 9a end before the rear, non-visible ends of the heat sink on the upper side 1d. The second of the cooling fins 54 does not extend up to the uppermost edge of the heat sink 50 on the front side 1b. The interconnections made between the main printed circuit board 23 and the additional printed circuit boards 25, or between the additional printed circuit boards 25, can include a wide variety of plug connectors. Besides printed circuit board plug connectors, cable plug connectors can be provided for the transfer of high frequency signals. For example, the rightmost additional printed circuit board 25 in FIG. 9a supports several antenna terminals 33, which are configured in accordance with the sub-miniature type-A ("SMA") standard. Electronic components which serve these antenna terminals 33 can be arranged on the adjacent additional printed circuit board, which also supports antenna terminals 33, with high frequency signals being exchanged between the two printed circuit boards via miniature high frequency plugs and coaxial cables. Suitable miniature high frequency plug connectors are, for example, ultra miniature telecommunications connectors ("UMTC"). For the coaxial cables, preferably those with a diameter in the region of one millimeter are used. It is also possible to arrange the electronic components which serve the antenna terminals 33 on the supplementary printed circuit board 24 or the backplane bus printed circuit board 21.

A further difference of the embodiment in FIG. 9a compared to that in FIGS. 7a-8b is the presence of a supplementary printed circuit board 24, which supplements the functionality of the main printed circuit board 23. This is arranged parallel to the main printed circuit board 23 and is connected to it via a printed circuit board connector arranged in the plane of the backplane bus printed circuit board 21 (see reference numeral 26 in FIGS. 7b and 7d). Radio and/or memory modules 241, for example, are arranged on the supplementary printed circuit board 24 on the side of the supplementary printed circuit board 24 that does not face the main printed circuit board 23. The radio and/or memory modules 241 are thus accessible after removal of the housing cover 60 (not shown here) or from opening a flap arranged in the side wall of the housing cover 60 to supplement or exchange the modules 241.

Figure 9B:
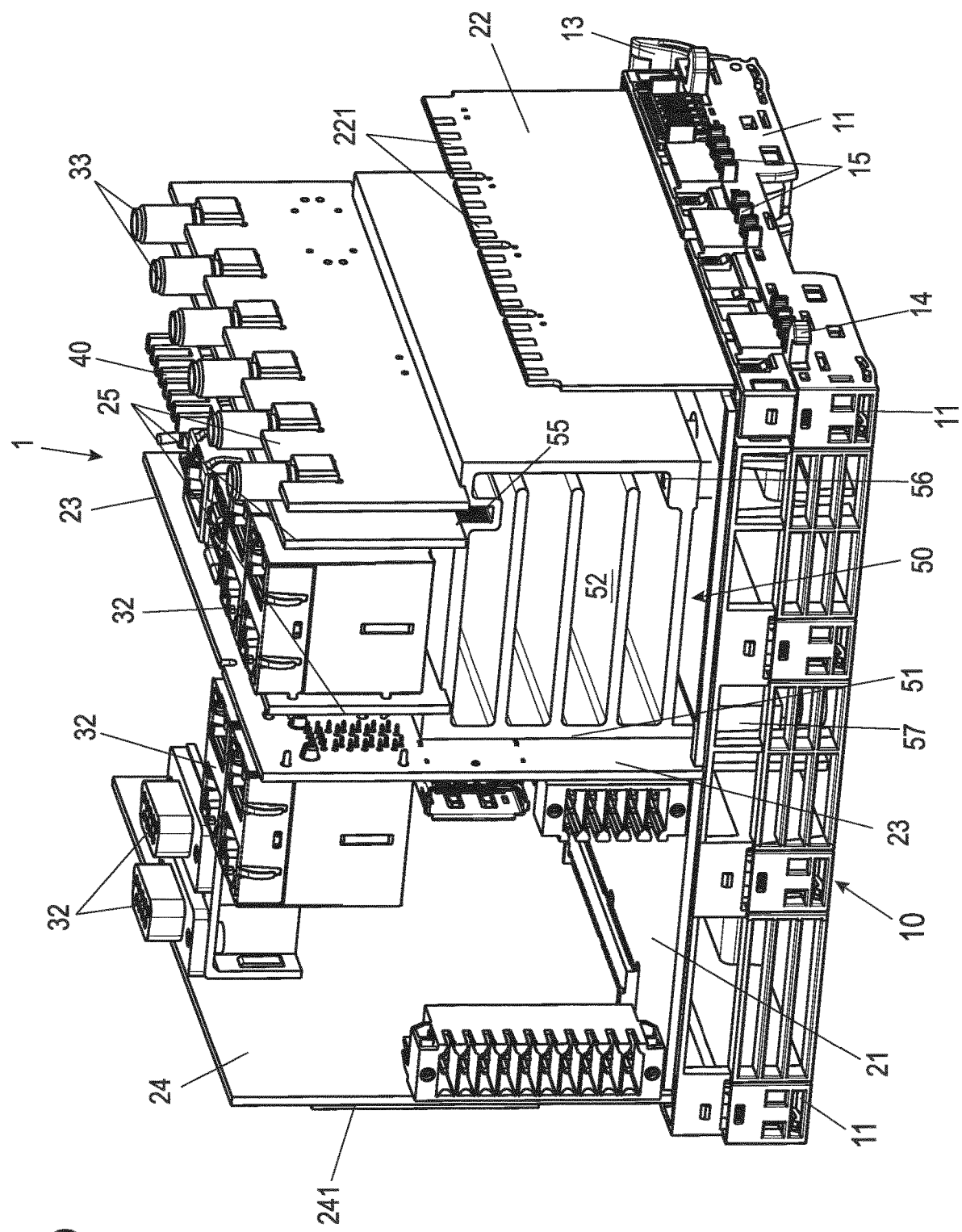
FIGS. 9b and 9c are isometric views, respectively, of a further exemplary embodiment of a main module of a controller without the housing cover.

FIG. 9b shows a further embodiment of a main module 1 of a controller that is similar to that of FIG. 9a. The main module 1 is shown in an oblique perspective view without the housing cover 60 shown. Unlike in FIG. 9a, however, the base 10 is shown.

The embodiment shown in FIG. 9b corresponds to that of FIG. 9a, in particular in relation to the heat sink 50. Here too, the heat sink 50 has mounting feet 57 which protrude into the base 10, and the main printed circuit board 23 and the backplane printed circuit board 21 are connected to the heat sink 50. Elements of the main printed circuit board 23 which are to be directly cooled, adjoin to one of the cooling surfaces 51 of the heat sink 50. To optimize the available equipment space on the main printed circuit board 23, the board extends into the base 10 as is the case in FIG. 9a. The main printed circuit board includes a recess in the central region, which is similar to that of the recess 231 shown in FIG. 7b.

Unlike the example in FIG. 9a, the heat sink 50 is generally parallelepipedal in its dimensions, without outer cooling fins 54 projecting upwards. Just like the example in FIG. 9a, the heat sink 50 does not extend over the entire height of the main printed circuit board 23, such that space for three additional printed circuit boards 25 remains above the heat sink 50. The additional printed circuit boards 25 support terminals 30, for example interface terminals 32 and/or antenna terminals 33 and switching and signal elements 40, similar to those shown in FIG. 9a. The heat sink also has an attachment groove 55 for fastening at least one of the additional printed circuit boards 25.

There is also a supplementary printed circuit board 24 that is arranged parallel to the main printed circuit board 23 on the side away from the heat sink 50. The spacing of the supplementary printed circuit board 24 from the main printed circuit board 23 is greater than in the example in FIG. 9a to provide further equipment installation space, in particular installation space for accommodating terminals 30.

The interface terminals 32 shown in FIG. 9b are D-SUB terminals 32 on the supplementary printed circuit board 24 and RJ-45 terminals on the main printed circuit board 23. To make optimum use of the installation space between the main printed circuit board 23 and the supplementary printed circuit board 24, components which protrude into this installation space, and in particular terminals such as the interface terminals 32, are arranged in such a way that they interlock with one another. On the outer side of the supplementary printed circuit board 24 away from the main printed circuit board, radio and/or memory modules 241 are provided, which provide additional functionalities or further memory space. In the housing cover 60 (not shown here), adjustable openings can be provided at appropriate locations, for example hinged flaps or removable covers, to provide access to the radio and/or memory modules 241.

Figure 9C:
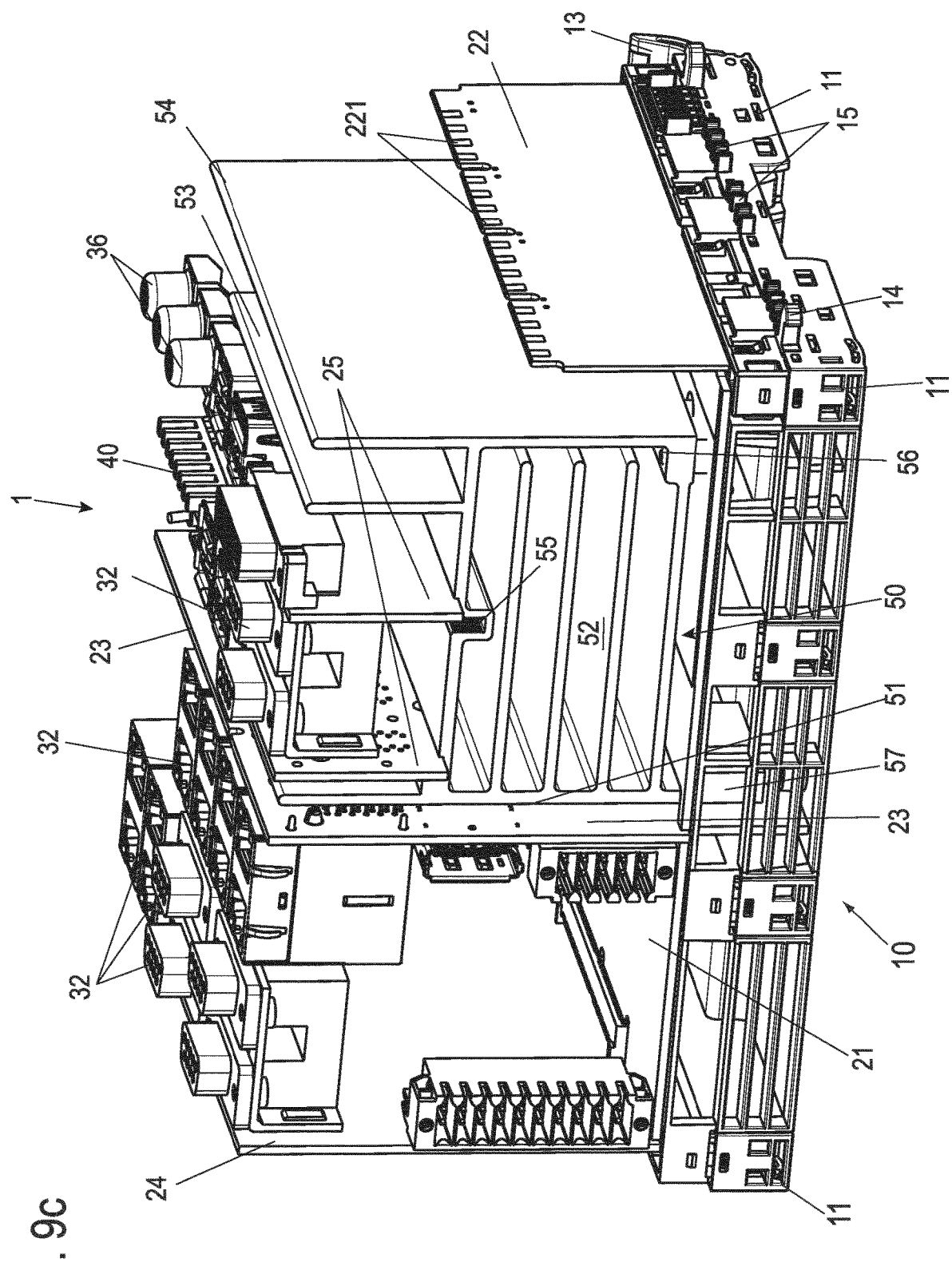

FIG. 9c shows a further embodiment of a controller in a manner similar to FIG. 9b and combines elements from the examples in FIGS. 9a and 9b. As in FIG. 9a, the heat sink 50 in FIG. 9c is also provided with outer cooling fins 54. As in FIG. 9b, the spacing between the main printed circuit board 23 and the supplementary printed circuit board 24 is widened in comparison with the example in FIG. 9a. This offers a larger installation space for equipping the printed circuit boards, and in particular for accommodating terminals 32. A comparison with FIG. 9b shows that further interface terminals 32 are used in FIG. 9c. The large space available for interface terminals 32 enables varying arrangements to be produced inexpensively, with the possibility of arranging many interface terminals 32 in a flexible manner.

Figure 10A:
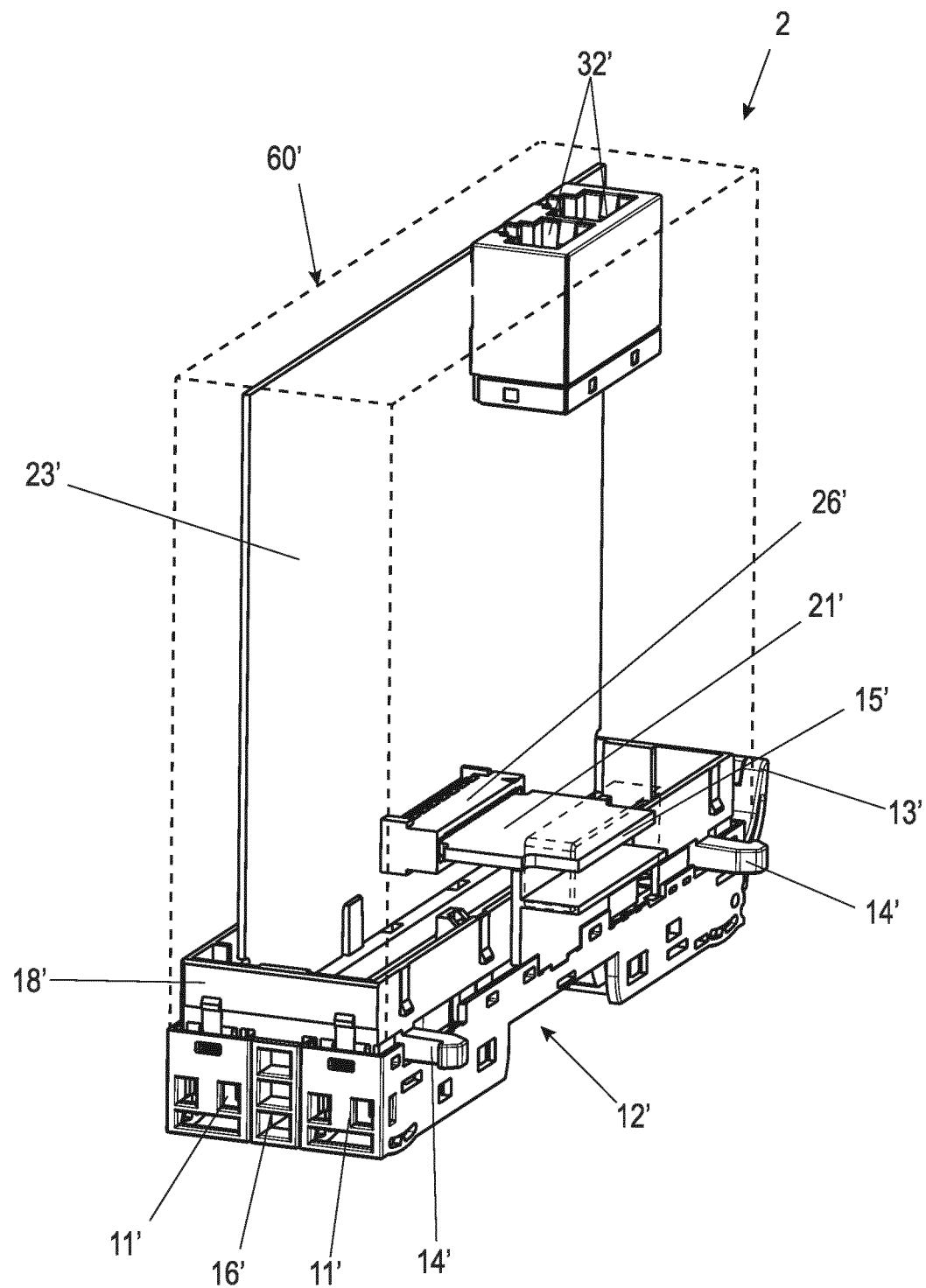
FIGS. 10a and 10b are isometric views, respectively, of a first exemplary embodiment of an expansion module for a control system.
Figure 10B:
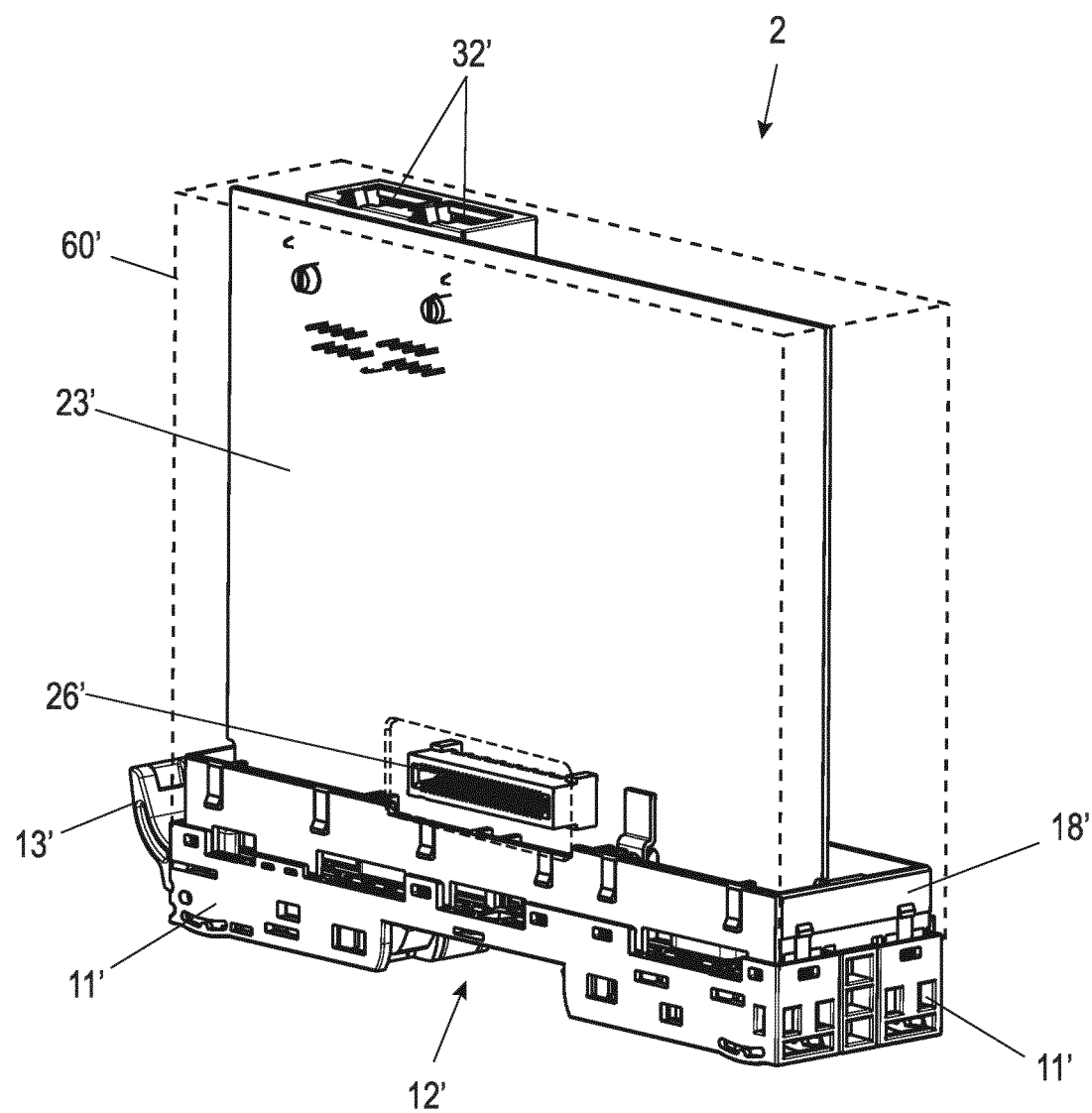
Figure 11A:
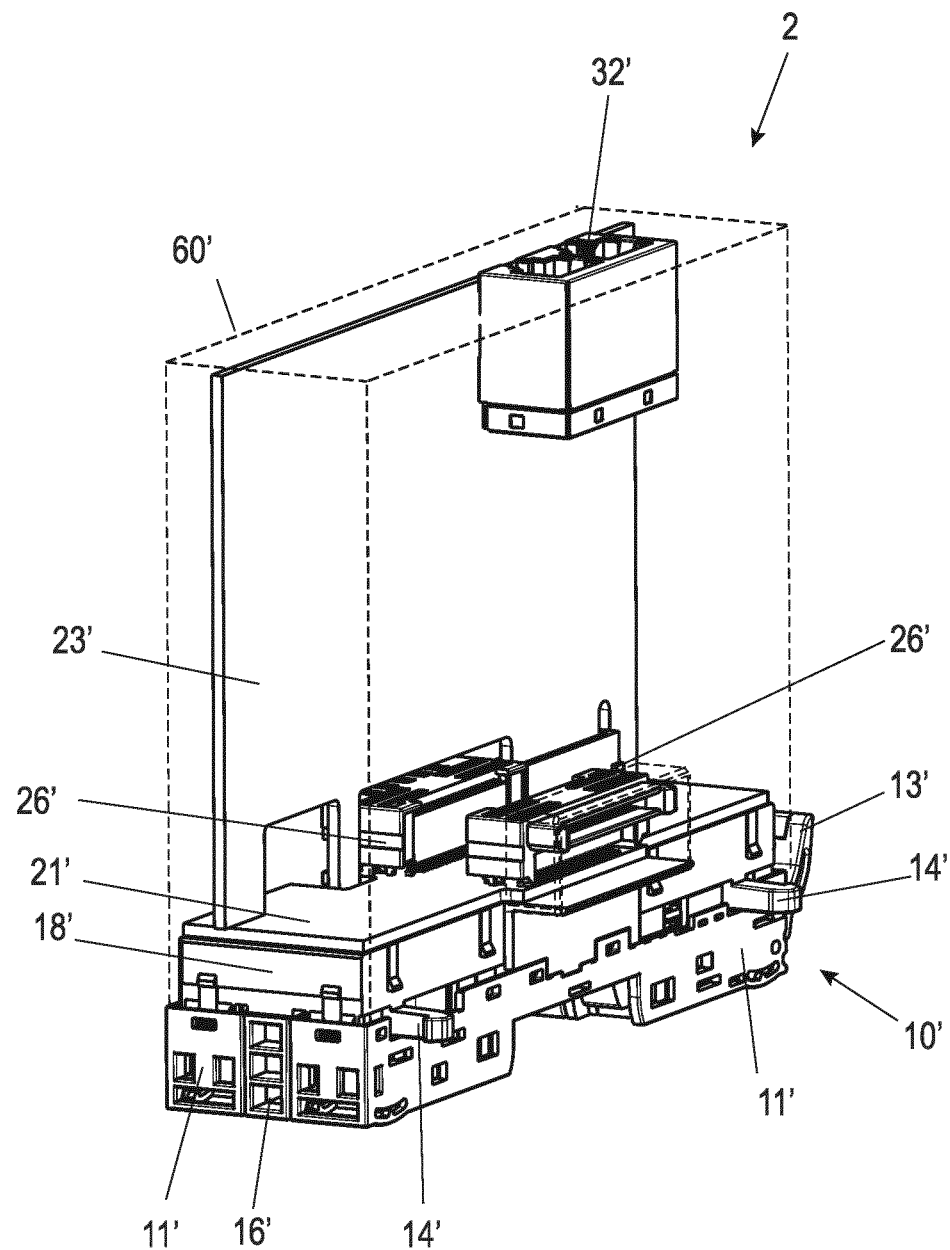
FIGS. 11a and 11b are isometric views, respectively, of a second exemplary embodiment of an expansion module for a control system.
Figure 11B:
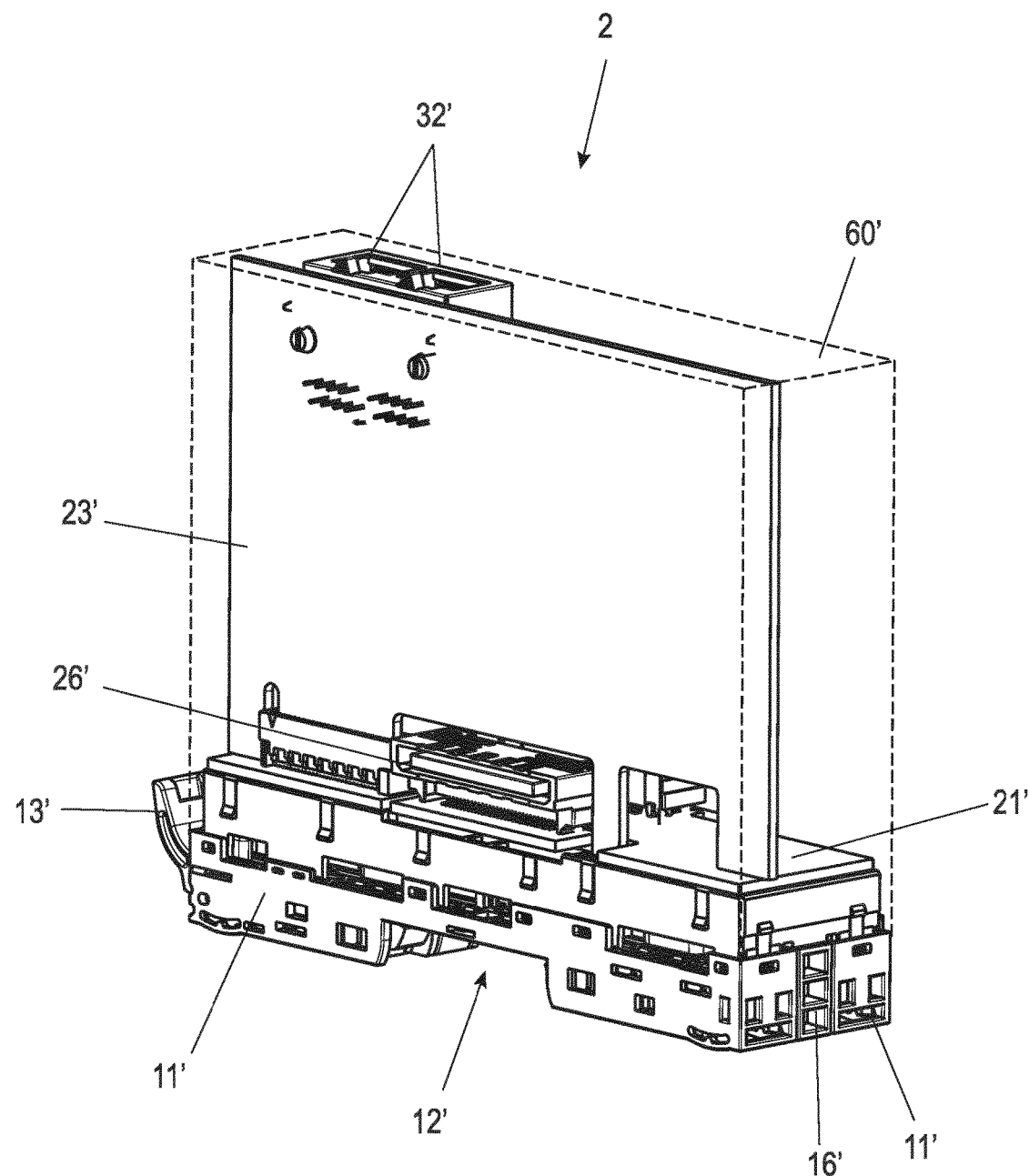

FIGS. 10a and 10b, 11a and 11b, and 12a and 12b show isometric views from different directions of three examples of an expansion module 2 for a control system, respectively. The first example shown in FIGS. 10a and 10b is also shown in the control system in FIG. 1. The second example of the expansion module 2 reproduced in FIGS. 11a and 11b is used in the example in FIGS. 2a to 2c.

In the case of the first example in FIGS. 10a and 10b, a main printed circuit board 23' is arranged perpendicular to the base frame 18', which has terminals, specifically interface terminals 32', on its upper edge facing the front side 1b.

In a section of the main printed circuit board 23' adjacent to the base 10', a 180° plug connector 26' is arranged, which provides plug contacts to both sides of the main printed circuit board 23'. A backplane bus printed circuit board 21' is inserted in the right side of the connector. The backplane bus printed circuit board extends outwardly to an opening in the housing cover 60' (depicted with dashed lines in the figure). When the expansion module 2 is plugged onto a main module 1, this backplane bus printed circuit board 21' contacts a corresponding plug connector in the main module 1. At the same time, as shown in FIG. 10b, a similar plug connector for contacting further expansion modules 2 is provided on the left side of the expansion module 2.

The example shown in FIGS. 11a and 11b differs from the first in that, as with the main module 1, a backplane bus printed circuit board 21' is arranged on the base frame 18'. It is oriented parallel to the mounting side 1a or front side 1b and has a plug connector 26' on each of the sides of the expansion module 2. The main printed circuit board 23' is fitted perpendicularly onto the backplane bus printed circuit board 21' and is electrically connected thereto via a further plug connector. A section of the main printed circuit board 23' protrudes into the base 10 to provide ground contact to a DIN rail via a contact spring arranged in the base 10.

Figure 12A:
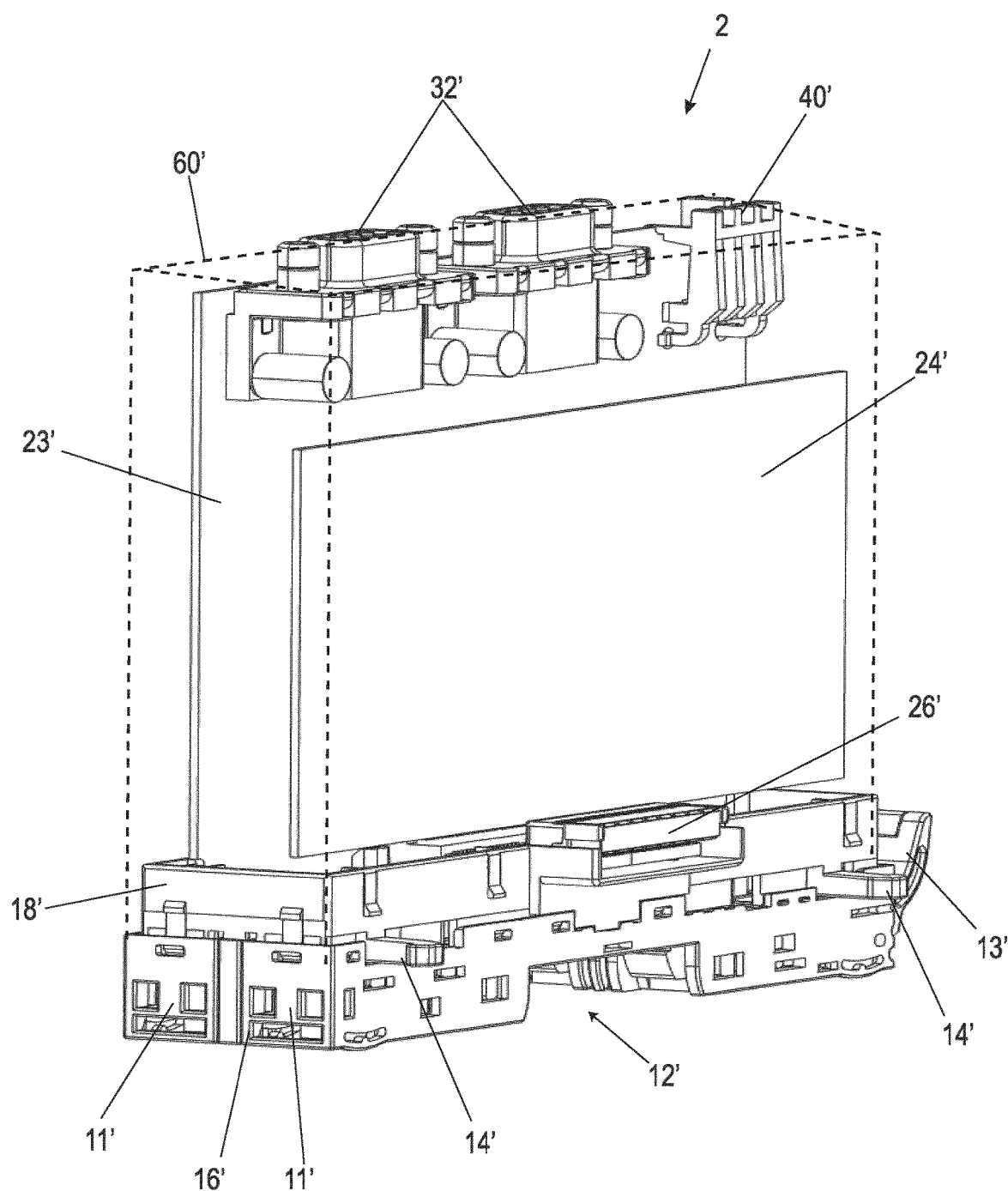
FIGS. 12a and 12b are isometric views, respectively, of a third exemplary embodiment of an expansion module for a control system.
Figure 12B:
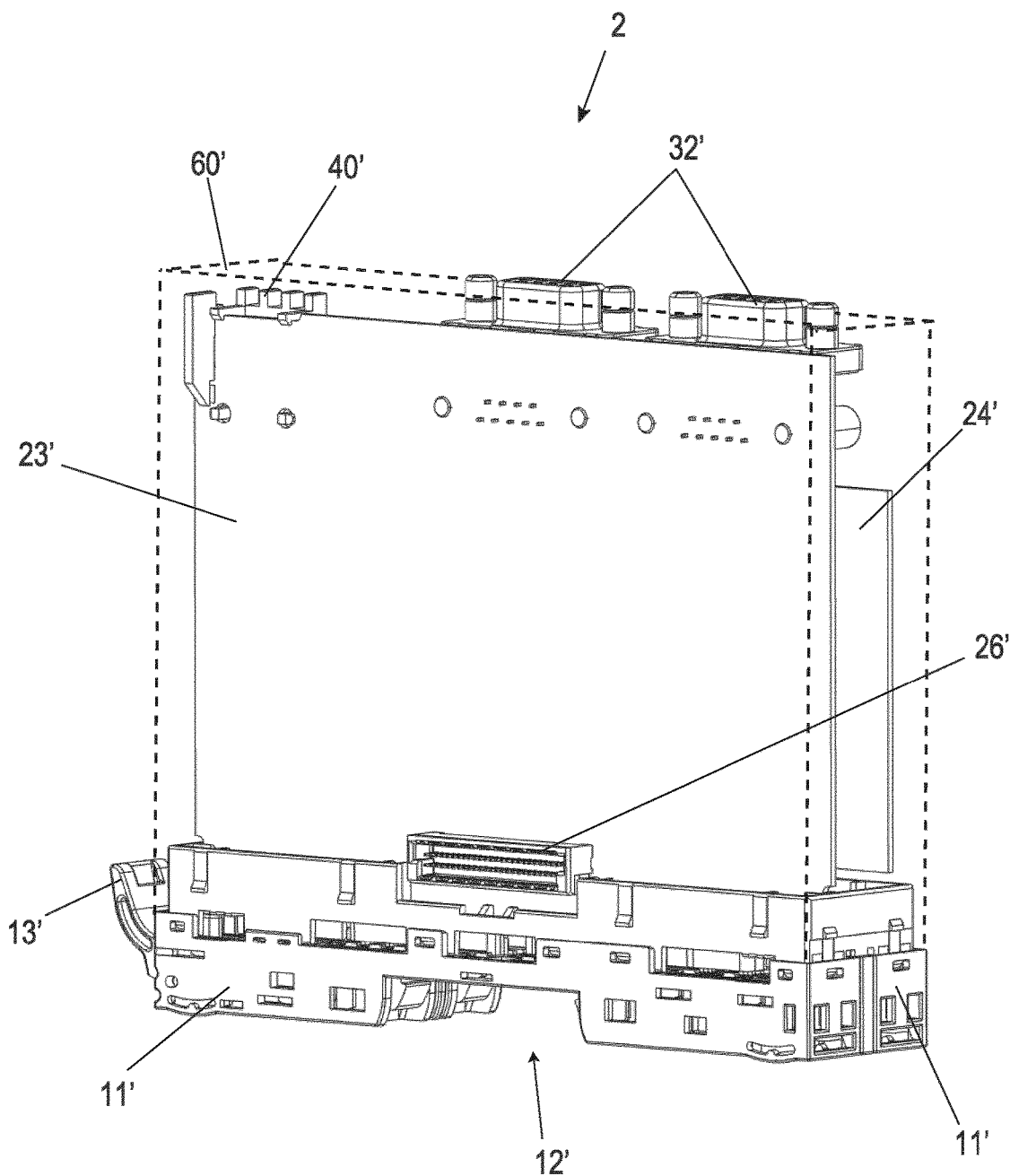

The expansion module 2 shown in FIGS. 12a and 12b differs from those described previously in that a supplementary printed circuit board 24' is provided in addition to and parallel to the main printed circuit board 23' to provide additional printed circuit board space for components. The supplementary printed circuit board 24' is arranged above the plug connector 26' and has a height that is less than that of the main printed circuit board 23'. In alternative configurations, the main printed circuit board 23' and the supplementary printed circuit board 24' can have the same installation height. In that case, interface terminals and/or switching and signal elements 40' can also be arranged on the supplementary printed circuit board 24'. In the depicted example, however, these are mounted exclusively on the main printed circuit board 23'. Similar to the main printed circuit board 23 and the supplementary printed circuit board 24 of the main module 1 (for example as shown in FIGS. 9a to 9c), the supplementary printed circuit board 24' can include toothed mutually engaging fittings with the expansion module 2, thus allowing for varying arrangement to be produced inexpensively with the same basic structure of the expansion modules 2.

The expansion modules 2 expand the control system by providing additional interfaces or application modules, which can contain functions or combinations of interfaces. Application modules combine functions for specific fields of application. Directly attaching the expansion modules 2 to the backplane bus of the main module 1 makes it possible to exchange high data rates via the expansion modules 2. The expansion modules 2 thus are "High-Speed-Modules" or can be an output module used for particularly short switching times. To expand the functional scope of the control system, the expansion modules 2 can also be memory modules, repeaters, camera modules, gateways, multipliers, switches or repeaters, media converters, data loggers, routers for data analysis, possibly with a sniffer and/or analysis function (e.g. with predictive analytics) or they can provide safety functions.

Figure 13A:
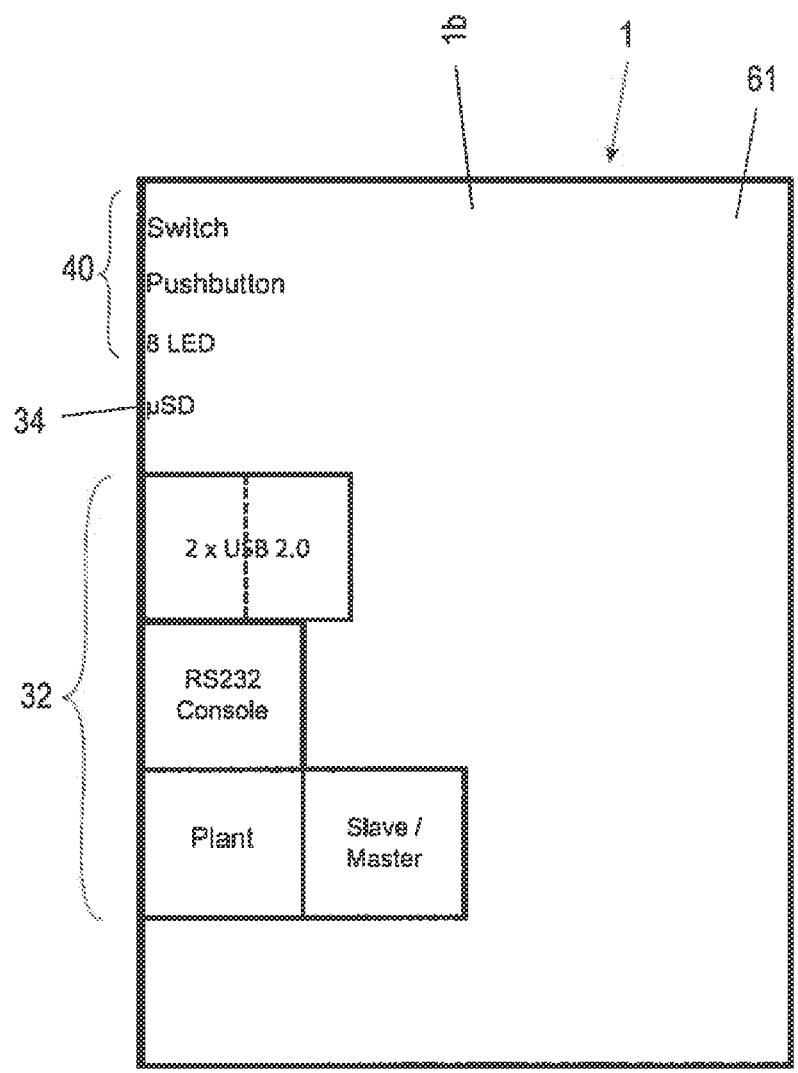
FIGS. 13a-13c are diagrammatic plan views, respectively, of a main module of a controller in various connection configurations.
Figure 13B:
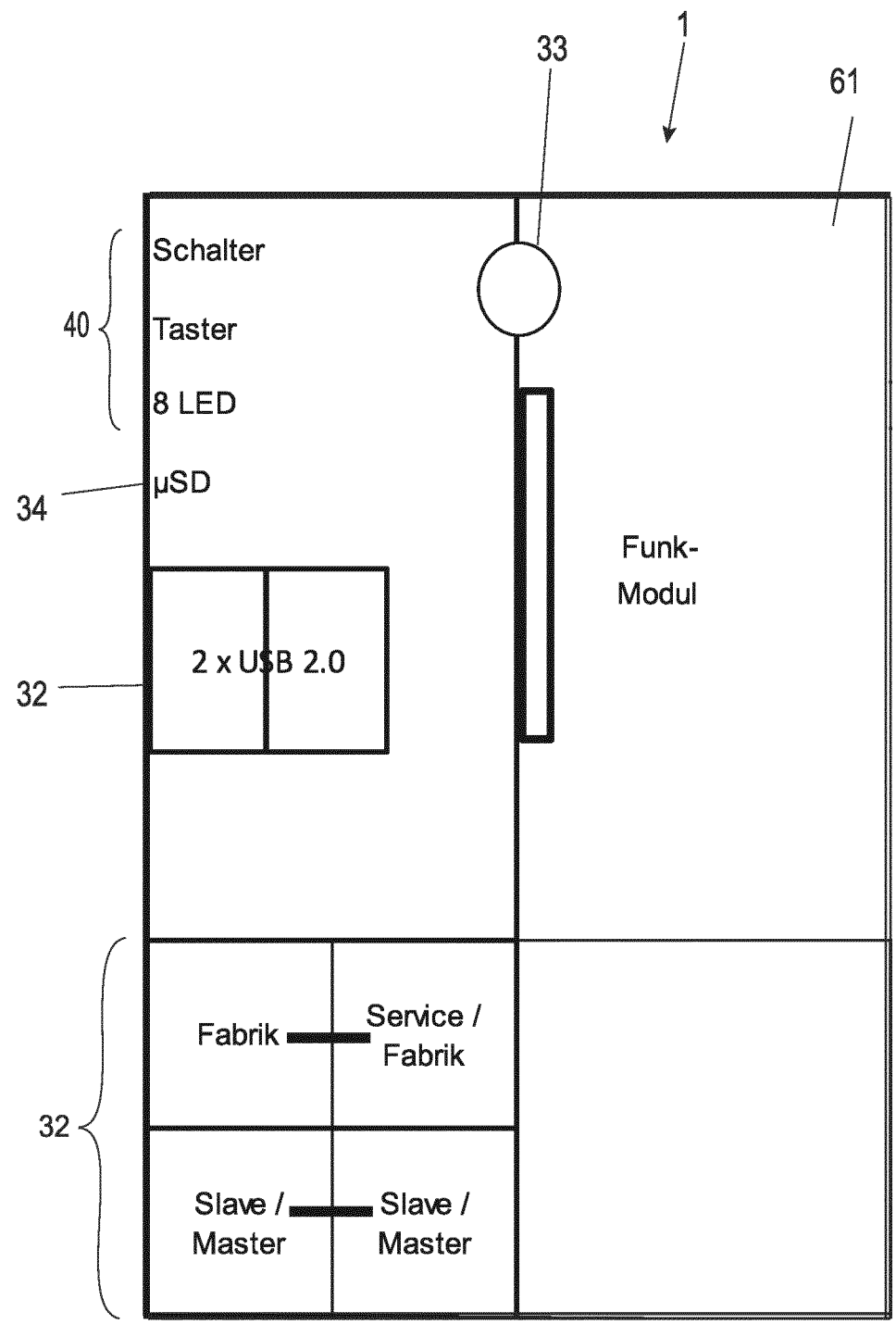
Figure 13C:
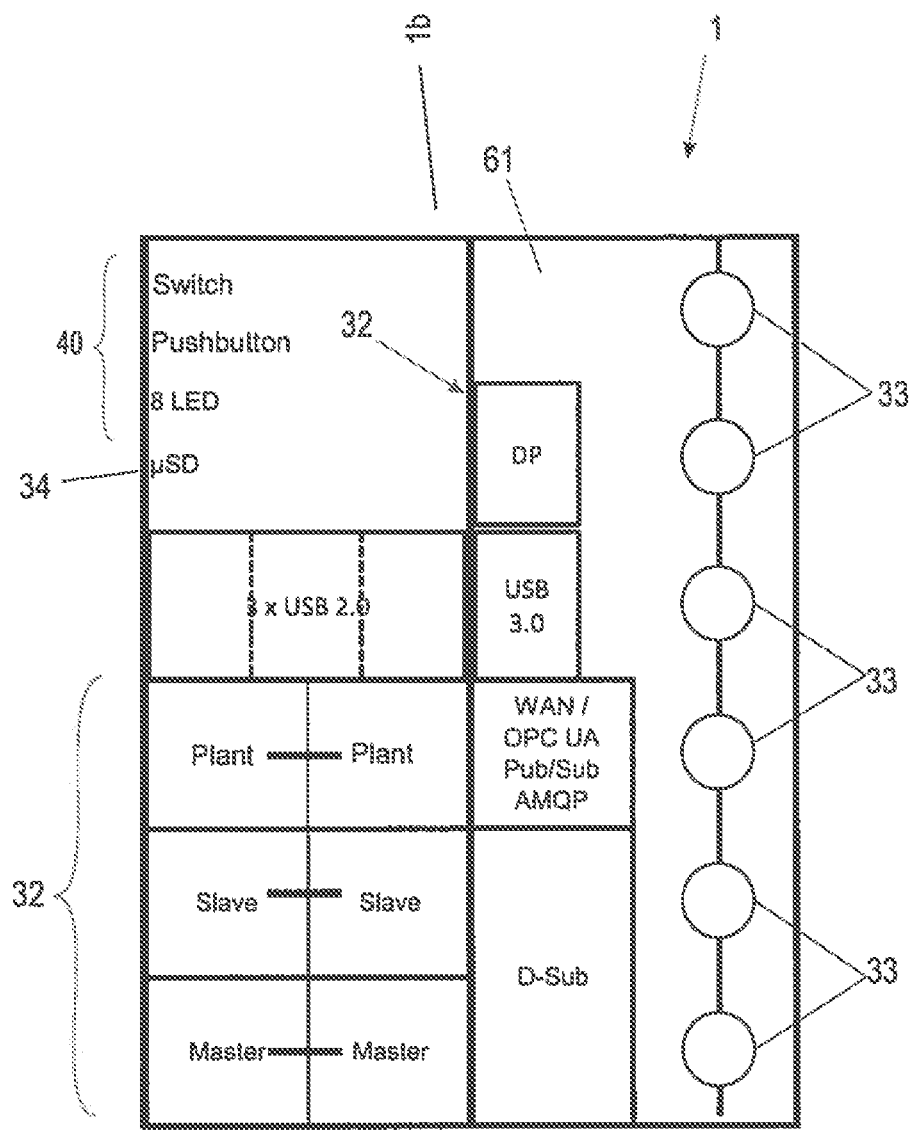

FIGS. 13a to 13c show diagrammatic views of the main cover 61 portion of the front side 1b of the main module 1.

Various possible configurations of the front side with terminals 32, 33, 34 and switching and signal elements 40 are shown. The various configurations in FIGS. 13a to 13c differ in the type of terminals 32, 33, 34 or switching and signal elements 40, and in particular, the density with which these terminals and switching and signal elements 40 are arranged on the front side 1b.

The embodiments shown in FIGS. 13a and 13b can be implemented via the basic structure of all the previously shown embodiments of a main module 1. The configuration shown in FIG. 13c with a very high density of terminals 32, 33, 34 and switching and signal elements 40 is preferably implemented with the embodiments shown in FIGS. 3a and 3b, 4a to 4c and 9a to 9c, since these embodiments include a supplementary printed circuit board 24, in addition to the main printed circuit board 23, to accommodate further interface terminals 32.

The invention claimed is:

1. A controller for an industrial automation system, comprising a main module including:
    (a) a housing having a base and a cover detachable from the base, said base having a recess configured for connection with a mounting rail;
    (b) a backplane bus printed circuit board arranged within said housing and connected with said base, said backplane bus printed circuit board oriented in a plane parallel to an extending direction of said recess, said backplane bus printed circuit board providing a backplane bus;
    (c) a main printed circuit board arranged within said housing and connected with said backplane bus printed circuit board, said main printed circuit board oriented perpendicularly to said backplane bus printed circuit board;
    (d) a heat sink arranged in said housing and mounted on said base, said heat sink having a first side facing said backplane bus printed circuit board and a second side facing said main printed circuit board for cooling circuit board components of said main printed circuit board; and
    (e) a plug connector coupled with said backplane bus of said backplane bus printed circuit board and configured for connection with at least one laterally stackable expansion module.

2. The controller as defined in claim 1, wherein said heat sink has a substantially parallelepipedal configuration including a first pair of parallel spaced walls arranged parallel to said main printed circuit board and a second pair of parallel spaced walls arranged parallel to said backplane bus printed circuit board.

3. The controller as defined in claim 2, wherein at least one outer surface of said heat sink comprises a cooling surface in thermal contact with said circuit board components of said main printed circuit board.

4. The controller as defined in claim 2, wherein said heat sink includes inner cooling fins defining cooling channels.

5. The controller as defined in claim 4, wherein said inner cooling fins are arranged perpendicular to said main printed circuit board.

6. The controller as defined in claim 1, wherein said backplane bus printed circuit board is arranged in parallel and in contact with an upper surface of said base and parallel to the mounting rail.

7. The controller claim 1, wherein said main printed circuit board and said backplane bus printed circuit board are attached to said heat sink.

8. The controller as defined in claim 7, wherein said heat sink includes at least one mounting foot protruding into and attached with said base.

9. The controller as defined in claim 1, wherein said heat sink, said main printed circuit board and said backplane bus printed circuit board comprise a mountable assembly connected with said base.

10. The controller as defined in claim 9, wherein said mountable assembly is connected with said base via at least one mounting foot.

11. The controller as defined in claim 1, wherein said main printed circuit board has at least one section extending into said base.

12. The controller as defined in claim 1, further comprising at least one additional printed circuit board arranged within said housing and connected with one of said main printed circuit board and said heat sink.

13. The controller as defined in claim 12, wherein said heat sink includes outer cooling fins arranged adjacent to said at least one additional printed circuit board and parallel to said main printed circuit board.

14. The controller as defined in claim 13, wherein one of said outer cooling fins has a shorter length than another of said outer cooling fins.

15. The controller as defined in claim 1, further comprising a supplementary printed circuit board arranged within said housing parallel to said main printed circuit board and connected with one of said main printed circuit board and said backplane bus printed circuit board.

16. The controller as defined in claim 15, wherein said circuit board components of said main printed circuit board and supplementary components of said supplementary printed circuit board mutually engage with each other.

17. A control system with a controller having a main module according to claim 1, said main module being connected with at least one laterally stackable expansion module via said backplane bus printed circuit board.

* * * * *